US00RE44811E

(19) United States
(12) Reissued Patent
Lee et al.

(10) Patent Number: US RE44,811 E
(45) Date of Reissued Patent: Mar. 18, 2014

(54) HIGH POWER LIGHT EMITTING DIODE PACKAGE

(75) Inventors: Seon Goo Lee, Kyungki-do (KR); Chang Wook Kim, Kyungki-do (KR); Kyung Taeg Han, Kyungki-do (KR)

(73) Assignee: Samsung Electronics Co., Ltd., Seoul (KR)

(21) Appl. No.: 13/330,239

(22) Filed: Dec. 19, 2011

Related U.S. Patent Documents

Reissue of:
(64) Patent No.: 7,208,772
Issued: Apr. 24, 2007
Appl. No.: 11/186,971
Filed: Jul. 22, 2005

U.S. Applications:
(63) Continuation of application No. 12/029,220, filed on Feb. 11, 2008, now Pat. No. Re. 43,200.

(30) Foreign Application Priority Data

Sep. 1, 2004 (KR) ..... 10-2004-69730
May 4, 2005 (KR) ..... 10-2005-37421

(51) Int. Cl.
*H01L 21/00* (2006.01)

(52) U.S. Cl.
USPC ..... 438/112; 257/99; 257/98; 257/676; 257/E33.056; 257/100; 257/E33.058; 257/692; 257/693; 257/696; 257/706; 257/E33.057; 257/E33.059

(58) Field of Classification Search
USPC ..... 257/99, 100, 676, 98, E33.058, 692, 257/693, 696, 706, E33.056–33.057, 257/33.059; 438/112
See application file for complete search history.

(56) References Cited

U.S. PATENT DOCUMENTS

| | | | | |
|---|---|---|---|---|
| 4,124,864 | A | 11/1978 | Stanley | |
| 6,943,433 | B2 | 9/2005 | Kamada | |
| 6,995,510 | B2 * | 2/2006 | Murakami et al. | 313/512 |
| 7,321,161 | B2 | 1/2008 | Teixeira et al. | |
| 2003/0168720 | A1 * | 9/2003 | Kamada | 257/666 |
| 2004/0075100 | A1 | 4/2004 | Bogner et al. | |
| 2005/0012187 | A1 * | 1/2005 | Kameyama et al. | 257/676 |

* cited by examiner

*Primary Examiner* — Dale E Page
(74) *Attorney, Agent, or Firm* — Lowe Hauptman & Ham, LLP

(57) ABSTRACT

The invention relates to a high power LED package, in which a package body is integrally formed with resin to have a recess for receiving an LED chip. A first sheet metal member is electrically connected with the LED chip, supports the LED chip at its upper partial portion in the recess, is surrounded by the package body extending to the side face of the package body, and has a heat transfer section for transferring heat generated from the LED chip to the metal plate of the board and extending downward from the inside of the package body so that a lower end thereof is exposed at a bottom face of the package body thus to contact the board. A second sheet metal member is electrically connected with the LED chip spaced apart from the first sheet metal member for a predetermined gap, and extends through the inside of the package body to the side face of the package body in a direction opposite to the first sheet metal member. A transparent sealant is sealingly filled up into the recess. The LED package raises thermal radiation efficiency with a simplified structure in order to reduce the size and thickness thereof.

7 Claims, 18 Drawing Sheets

HIGH POWER LIGHT EMITTING DIODE PACKAGE

Matter enclosed in heavy brackets [ ] appears in the original patent but forms no part of this reissue specification; matter printed in italics indicates the additions made by reissue.

*Notice: More than one reissue application has been filed for the reissue of U.S. Pat. No. 7,208,772. The reissue applications are the present application, Ser. No. 12/029,220 and Ser. No. 13/294,405. Ser. No. 12/029,220 is a reissue application of U.S. Pat. No. 7,208,772. The present application and Ser. No. 13/294,405 are Continuation Reissue Applications of Ser. No. 12/029,220.*

CLAIM OF PRIORITY

This application claims the benefit of Korean Patent Application Nos. 2004-69730 filed on Sep. 1, 2004 and 2005-37421 filed on May 4, 2005, in the Korean Intellectual Property Office, the disclosures of which are incorporated herein by reference.

BACKGROUND OF THE INVENTION

1. Field of the Invention

The present invention relates to a Light Emitting Diode (LED) package, and more particularly, a high power LED package designed to raise thermal radiation efficiency with a simplified structure in order to reduce the size and thickness thereof.

2. Description of the Related Art

LEDs are one type of semiconductors, and generate various colors of light when applied with voltage. When each LED generates light, its color is generally determined by chemical ingredients of the LED. Demand for the LEDs is continuously growing since the LEDs have various merits such as long lifetime, low drive voltage, excellent initial drive properties, high vibration resistance and high tolerance with respect to repeated power switching compared to lighting devices using filaments.

However, the LEDs also fail to convert electricity into light for 100%, thereby creating a considerable amount of heat. As a consequence, the LEDs adopt metal lead frames to radiate heat to the outside because internal components of the LEDs become stressed owing to their thermal expansion coefficient difference if heat is not properly dissipated.

In particular, some LEDs such as high power LEDs are recently adopted in illumination systems and backlight units for large-sized Liquid Crystal Displays (LCDs). Such high power LEDs are required to have superior thermal radiation performance because these systems or units require larger power.

FIG. 1 is a perspective sectional view of a conventional high power LED package. Referring to FIG. 1, the LED package 1 includes an LED chip 2 made of for example InGaN semiconductor, a metal slug 3 for seating the LED chip 2 thereon while functioning as heat guide means, a housing 4 for containing the metal slug 3, a silicone encapsulant 5 for sealing the LED chip 2 and the top of the metal slug 3, a plastic lens 6 for covering the silicon encapsulant 5, and a pair of wires 7 (only one is shown) for supplying voltage to the LED chip 2. In the meantime, the wires 7 are electrically connected with terminals 8. The LED chip 2 is connected to a submount by means of solders, and the submount seats the LED chip 2 on the metal slug 3.

Referring to FIG. 2, the LED package 1 of FIG. 1 is mounted on a board 10 of a heat sink, and a thermal conductive pad 9 such as solder is interposed between the metal slug 3 of the LED package 1 and the board 10 to facilitate the heat conduction between them.

The LED package 1 and its mounting structure on the board 10 as shown in FIGS. 1 and 2 are focused on thermal radiation to efficiently radiate heat to the outside. That is, the LED package 1 is so designed that the metal slug 3 as a heat sink is mounted directly or via the thermal conductive pad 9 on the board 10 in order to absorb heat generated from the LED chip 2 and radiate heat to the outside. Then, a major quantity of heat from the LED chip 2 flows through the metal slug 3 to the board 10 and only a minor quantity of heat is radiated to the air through the surface of the LED package 1 including the housing 4 and the lens 6.

Thanks to these reasons, LED packages of the above structure are widely adopted in the LED field.

However, the above conventional thermal radiation structure of the LED package has a bulky size thereby to obstruct the miniaturization of an illumination system. This structure is also complicated obstructing the automation of LED package production as well as requiring a large number of components to be assembled together thereby to burden manufacture cost.

SUMMARY OF THE INVENTION

The present invention has been made to solve the foregoing problems of the prior art and it is therefore an object of the present invention to provide a high power Light Emitting Diode (LED) package in which radiating means conducting heat generated from LED chip to a metal plate of a board is made into a sheet metal member, thereby raising thermal radiation efficiency while reducing the size and thickness thereof It is another object of the invention to provide a high power LED package which secures effective radiating means and in which a package body thereof is injection-molded with resin, thereby simplifying a construction thereof and facilitating its manufacture as well.

It is still another object of the invention to provide a high power LED package in which a sheet metal member serving as both radiating means and a terminal is fixedly surrounded with a resinous package body, thereby obtaining a thinner and solid construction thereof.

According to an aspect of the invention for realizing the object, there is provided a high power Light Emitting Diode (LED) package mounted on a board, which includes a metal plate of a heat sink, an insulating layer on the metal plate and a conductive pattern printed with plural pattern lines on the insulating layer, the high power LED package comprising: an LED chip; a package body integrally formed with resin to have a recess for receiving the LED chip; a first sheet metal member electrically connected with the LED chip while supporting the LED chip at its upper partial portion in the recess, the first sheet metal member surrounded by the package body and extending to the side face of the package body, the first sheet metal member having a heat transfer section for transferring heat generated from the LED chip to the metal plate of the board and extending downward from the inside of the package body so that a lower end thereof is exposed at a bottom face of the package body thus to contact the board; a second sheet metal member electrically connected with the LED chip spaced apart from the first sheet metal member for a predetermined gap, the second sheet metal member extending through the inside of the package body to the side face of the package body in a direction opposite to the first sheet metal member; and a transparent sealant sealingly filled up into the recess.

Preferably, the heat transfer section of the first sheet metal member is protruded downward from the bottom face of the package body.

Preferably, the first and second sheet metal members each have at least one hole, and the package body has a plurality of connecting posts that are integrally formed and connected with the upper and lower portions of the package body through the holes.

Preferably, the first sheet metal member is contacted with one electrode of the LED chip, and further has an external terminal integrally formed therewith to extend over the outside of the package body thereby contacting one pattern line of the board, and wherein the second sheet metal member is connected at one end of the recess-side with the other electrode of the LED chip and extended at the other end of the recess-side out of the package body, thereby contacting the other pattern line of the board.

Preferably, the second sheet metal member is divided into a pair of first and second terminals insulated from each other, in which the first terminal is connected at one end with one electrode of the LED chip and extended at the other end out of the package body, thereby contacting one pattern line of the board, and wherein the second terminal is connected at one end with the other electrode of the LED chip and extended at the other end over the outside of the package body, thereby being contacting the other pattern line of the board.

Preferably, the heat transfer section of the first sheet metal member has a T-shaped cross section and extends downwardly.

Alternatively, the heat transfer section of the first sheet metal member is formed such that its lower end facing the second sheet metal member is cut at a slant away from the second sheet metal member and the cut portion of the heat transfer section is covered with the package body.

According to another aspect of the invention for realizing the object, there is provided a high power Light Emitting Diode (LED) package mounted on a board, which includes a metal plate of a heat sink, an insulating layer on the metal plate and a conductive pattern printed with plural pattern lines on the insulating layer, the high power LED package comprising: an LED chip; a package body integrally formed with resin to have a recess for receiving the LED chip; a half T-shaped first sheet metal member electrically connected with the LED chip while supporting the LED chip at its upper partial portion in the recess, the first sheet metal member surrounded by the package body and extending to the side face of the package body, wherein the first sheet metal member has an upper section electrically connected at one end with the LED chip and a lower section overlapped on the lower portion of the upper section, the bottom surface of the lower section being exposed through the bottom face of the package body to contact the board; a second sheet metal member electrically connected with the LED chip spaced apart from the first sheet metal member for a predetermined gap, the second sheet metal member extending through the inside of the package body to the side face of the package body in a direction opposite to the first sheet metal member; and a transparent sealant sealingly filled up into the recess.

Preferably, the upper and lower sections of the first sheet metal member are bonded together with conductive epoxy with high thermal and electric conductivities.

Preferably, wherein the first sheet metal member is folded up at the other end that is exposed through the package body side so that the upper and lower sections thereof are overlapped vertically on each other.

Preferably, the other ends of the first and second sheet metal members are protruded from a sidewall of the package body.

Preferably, the second sheet metal member has a structure symmetrical to that of the first sheet metal member.

Preferably, the first and second sheet metal members are protruded at their lower ends downwardly from the bottom face of the package body.

According to still another aspect of the invention for realizing the object, there is provided a high power Light Emitting Diode (LED) package mounted on a board, which includes a metal plate of a heat sink, an insulating layer on the metal plate and a conductive pattern printed with plural pattern lines on the insulating layer, the high power LED package comprising: an LED chip; a package body integrally formed with resin to have a recess for receiving the LED chip; a first sheet metal member electrically connected with the LED chip while supporting the LED chip at its upper partial portion in the recess, the first sheet metal member surrounded by the package body and extending to the side face of the package body, with a partial bottom surface of the first sheet metal member bent downward to be exposed through the bottom face of the package body and to contact the conductive pattern of the board; a second sheet metal member electrically connected with the LED chip spaced apart from the first sheet metal member for a predetermined gap, the second sheet metal member extending through the inside of the package body to the side face of the package body in a direction opposite to the first sheet metal member; and a transparent sealant sealingly filled up into the recess.

Preferably, the bent shape of the first sheet metal member is formed by etching or press working of a source sheet metal.

Preferably, a lower portion of the first sheet metal member is exposed at a middle portion in length through the bottom face of the package body. At this time, the exposed lower portion of the first sheet metal member is extended out of the bottom face of the package body.

Preferably, the other end of the first sheet metal member is protruded out of a sidewall of the package body.

Meanwhile, preferably, the bottom surface of the first sheet metal member adjacent to one side thereof is cut at a slant away from the second sheet metal member, and the cut portion of the heat transfer section is covered with the package body.

In addition, preferably, the second sheet metal member has a structure symmetrical to that of the first sheet metal member.

The LED packages above may further comprise a high reflectivity reflective layer coated on the inner surface of the recess.

Preferably, any one of the LED packages above may further comprise a lens assembled onto the upper surface of the package body, and wherein the package body has a step at its upper edge so as to be engaged with the lower portion of the lens.

DETAILED DESCRIPTION OF THE PREFERRED EMBODIMENT

Hereinafter the above and other objects, features and other advantages of the present invention will be more clearly understood from the following detailed description taken in conjunction with the accompanying drawings.

Figure 3:
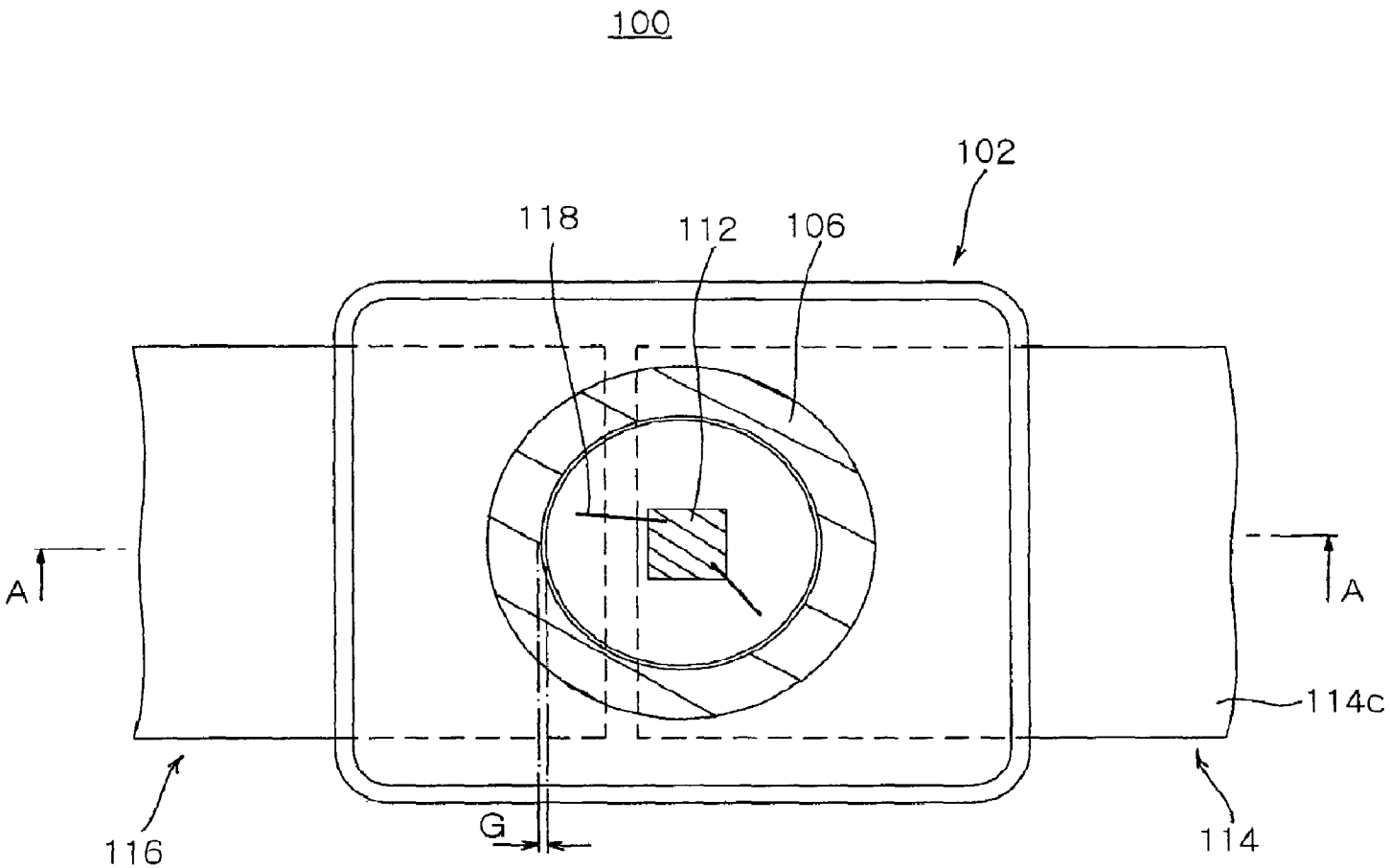
FIG. 3 is a plan view illustrating a high power LED package according to a first embodiment of the invention.

First, a high power Light Emitted Diode (LED) package according to a first embodiment of the present invention will now be described with reference to FIGS. 3 through 6. FIG. 3 is a plan view illustrating a high power LED package according to a first embodiment of the invention, FIG. 4 is a sectional view taken along a line A-A of FIG. 3, FIG. 5 is a plan view illustrating the high power LED package of FIG. 3 with the upper portion of the package body removed, and FIG. 6 is a bottom view of FIG. 3.

As shown in FIGS. 3 through 6, the high power LED package 100 of the present invention is used as mounted on a board (see FIG. 10) having a metal plate of a heat sink, an insulating layer on the metal plate and a conductive pattern printed with plural pattern lines on the insulating layer. The high power LED package includes an LED chip 112 for emitting light when applied with electric current, a package body 102 integrally formed with resin and having a recess 108 to receive the LED chip 112, a first sheet metal member 114 positioned in the package body 102, functioning as a terminal and radiating means while supporting the LED chip 112, a second sheet metal member 116 functioning as a terminal, and a sealant 110 for sealingly filling up the recess 108.

First, the package body 102 is formed by injection molding of resin, such that the upper surface of the upper portion 102A thereof is sunk toward its center portion, forming the recess 108. Herein, the inner wall of the recess 108 is preferably formed to have a certain slant. A lower portion 102B of the package body receives the first and second sheet metal members 114 and 116 together with the upper portion 102A of the package body.

Figure 4:
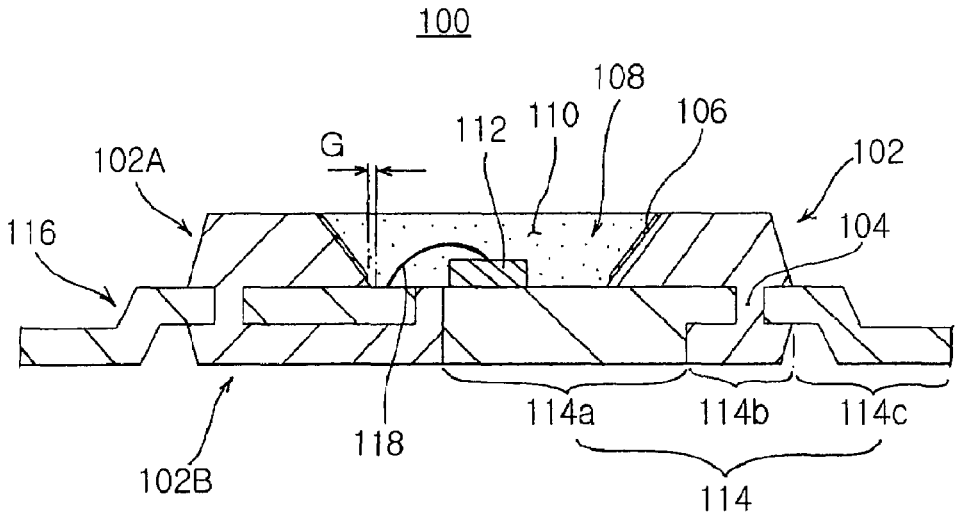
FIG. 4 is a sectional view taken along a line A-A of FIG. 3.
Figure 5:
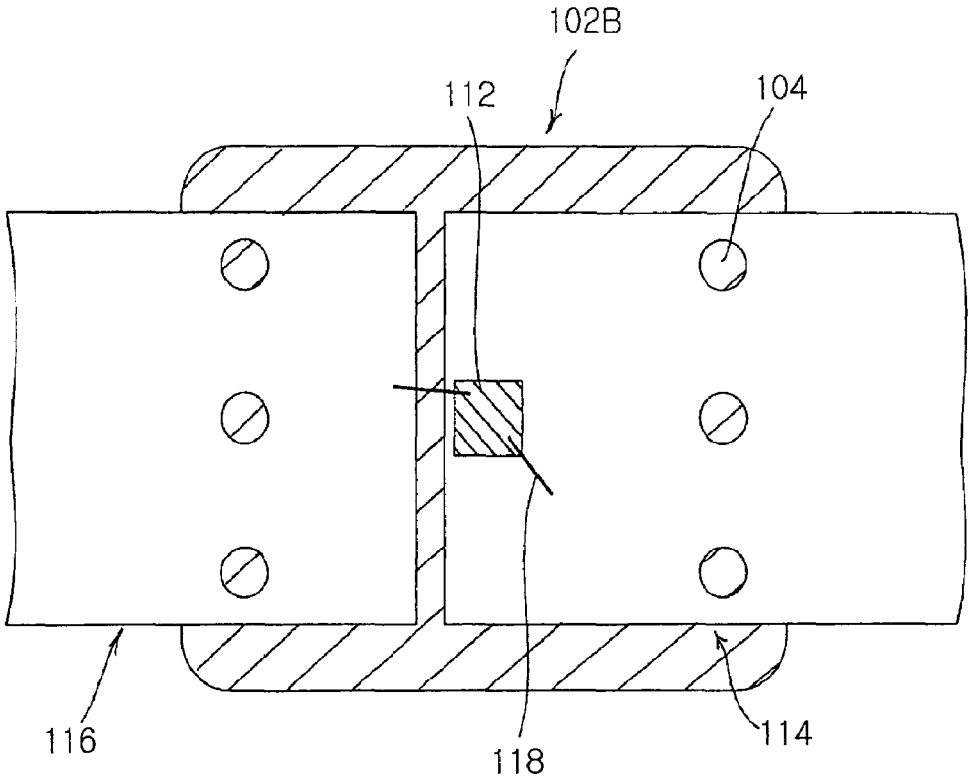
FIG. 5 is a plan view illustrating the high power LED package of FIG. 3 with the upper portion of the package body removed.
Figure 6:
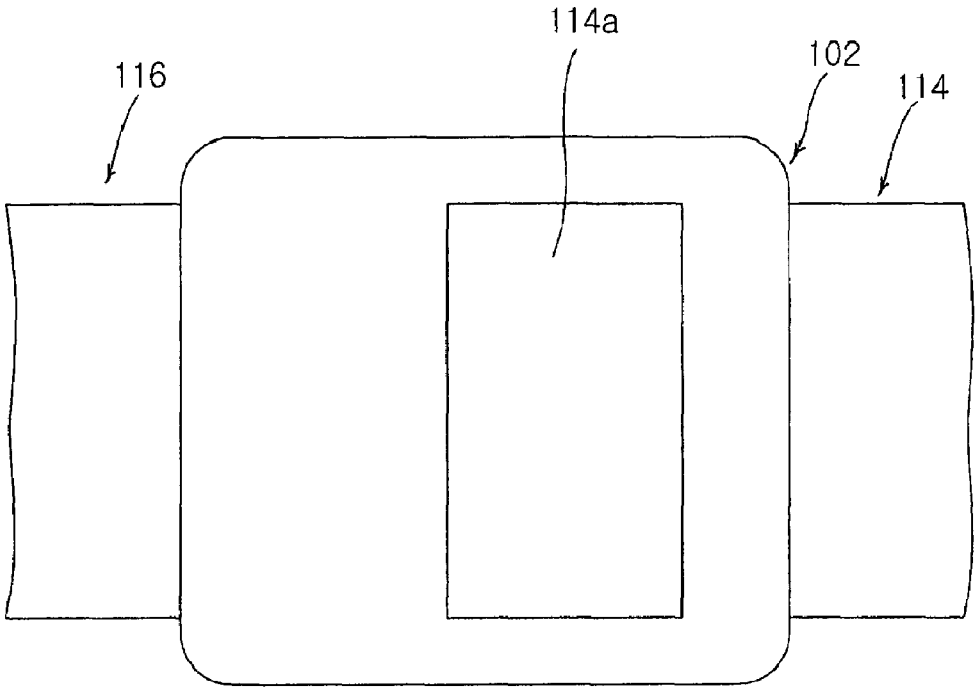
FIG. 6 is a bottom view of FIG. 3.

Herein, as shown in FIGS. 4 and 5, the upper and lower portions 102A and 102B of the package body are connected with each other at their both longitudinal edges as well as by a plurality of posts 104 extending vertically through holes formed to the first and second sheet metal members 114 and 116. Thus, the posts serve to strengthen a connection between the upper and lower portions 102A and 102B of the package body. Meanwhile, although illustrated as a circular shape, the sectional end shape of the post may become oval or rectangular. In this case, because a cross-sectional area thereof becomes larger at the same width position relative to the circular shape, the connection between the upper and lower portions 102A and 102B of the package body may be further strengthened.

Figure 1:
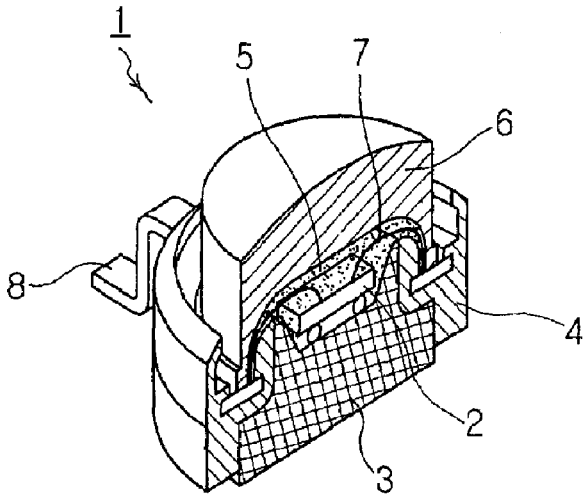
PRIOR ART FIG. 1
FIG. 1 is a sectional perspective view illustrating a conventional high power LED package.
Figure 2:
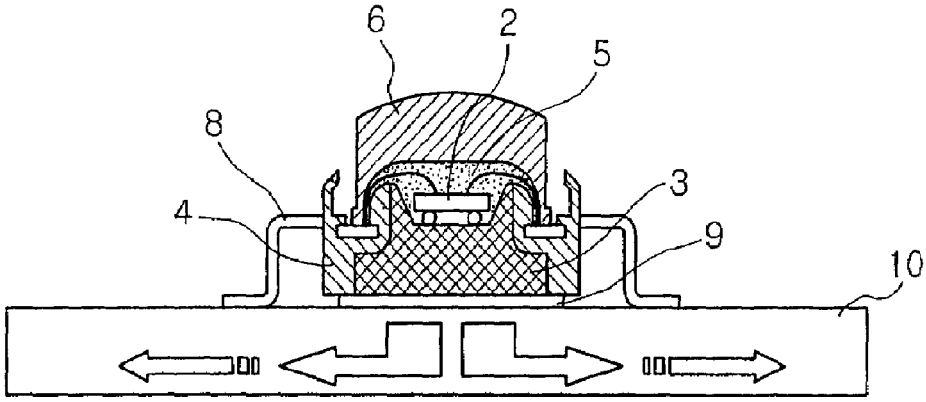
PRIOR ART FIG. 2
FIG. 2 is a sectional view illustrating the high power LED package of FIG. 1 mounted on a board.

A first section 114a of the first sheet metal member 114 supports at its upper portion the LED chip 112 in the recess 108, and extends downwardly through the inside of the package body 102 thus to be exposed at its lower portion through the bottom surface of the lower portion 102B of the package body 102 to the outside thereof. As a result, heat generated at the LED chip 112 can be transferred smoothly through the first section 114a of the first sheet metal member 114 to the metal plate of the board. That is, it can be understood that in the present invention, the first section 114a of the first sheet metal member 114 may function as radiating means. Herein, since the first section 114a of the first sheet metal member 114 as radiating means, is a part of the sheet metal member, a thickness thereof is seriously reduced relative to the metal slug 3 (see FIGS. 1 and 2) of the prior art. It can be accordingly seen that a heat transfer path from the LED chip 112 to the metal plate below the first section 114a is greatly reduced, thereby increasing thermal radiation efficiency considerably.

A second section 114b of the first sheet metal member 114 is a portion integrally extended from the first section 114a toward the side of the package body 102, whose thickness is reduced relative to the first section 114a such that its upper surface extends on the same plane as the upper portion of the first section 114a, and its bottom face is stepped upwards from the lower portion of the first section 114a. Thus, differently from the first section 114a, the second section 114b extends laterally toward the side of the package body 102 without being exposed at its bottom face to the outside, thereby being connected with a third section 114a outside of the package body 102. The third section 114c extends integrally with and in the same thickness as the second section 114b, and has at its middle portion a bent portion twice-bent so as to facilitate the connection with one pattern line of the conductive pattern of the board. The third section 114c functions as an external terminal in the first sheet metal member 114.

The second sheet metal member 116 extends in an opposite direction and spaced apart for a predetermined gap from the first sheet metal member 114. The second sheet metal member 116 extends laterally with a certain thickness from the inside of the package body 102 toward outside of the package body 102, and a portion thereof outside the package body has a bent portion twice-bent so as to facilitate the connection with the other pattern line of the conductive pattern of the board. A cross-sectional shape of these sheet metal members 114 and 116 may be formed by, for example, cutting and punching a source sheet metal plate, and selectively reducing thickness through etching and the like.

Herein, the first and second sheet metal members 114 and 116 are connected with the electrodes, respectively, of the LED chip 112 by means of a pair of wires 118. As a result, the LED chip 112 can be supplied with electric power from a power supply through the wires 118, the first and second sheet metal members 114 and 116, and the conductive pattern of the board.

A reflective layer 106 composed of a high reflectivity film is formed at an inner wall of the recess 108 in order to effectively guide light emitted from the LED chip 112 upwards. The reflective layer 106 may be formed by coating Ag, Pt, Al or alloy thereof onto the inner wall of the recess 108 with for example, an electroless plating or a deposition and the like. Alternatively, the recess 108 is precisely machined at its inner wall so that a certain amount of reflectivity may be achieved although it is not perfect. Furthermore, a glass layer may be formed on the inner wall of the recess 108 so as to intensify a function of reflecting mirror using a density difference from resin of the package body below the glass layer.

Figure 7:
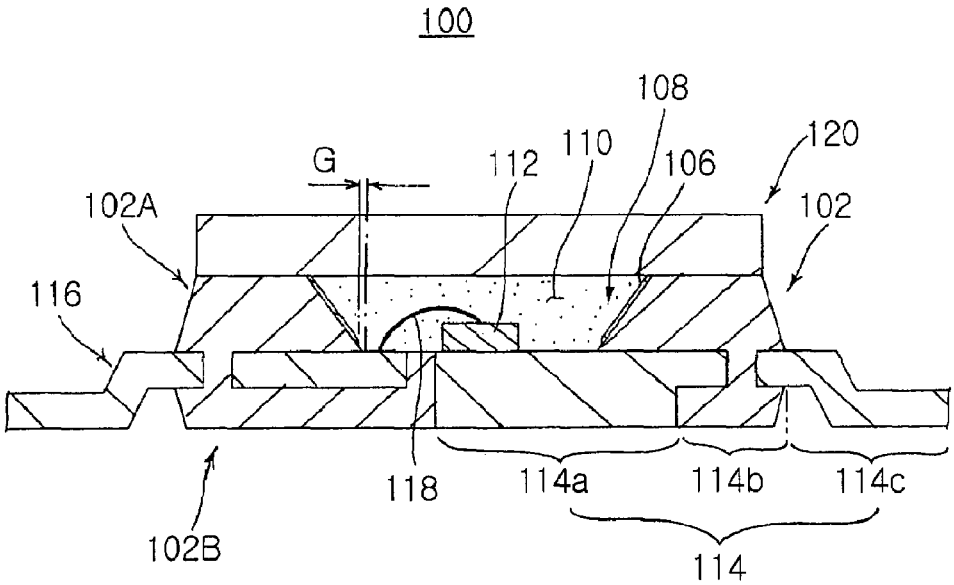
FIG. 7 is a sectional view illustrating the high power LED package according to the first embodiment of the present invention with a lens attached thereto.

FIG. 7 is a sectional view illustrating the high power LED package 100 according to the first embodiment of the present invention with a lens attached thereto. In FIG. 7, the lens 120 is attached to the upper surface of the package body 102 to protect a sealant 110 and the LED chip 112 contained therein. Herein, the lens 120 is generally transferred and formed onto the package body 102, or otherwise fabricated separately and then bonded to the package body 102 with proper means such as an adhesive and the like.

Structured like this, the first and second sheet metal members 114 and 116 with a simple construction serve as radiating means and terminals, and the integrated package body 102 injection-molded with resin bonds these members strongly, thereby greatly improving thermal radiation efficiency as well as securing excellent robustness while reducing their dimension significantly.

Figure 8:
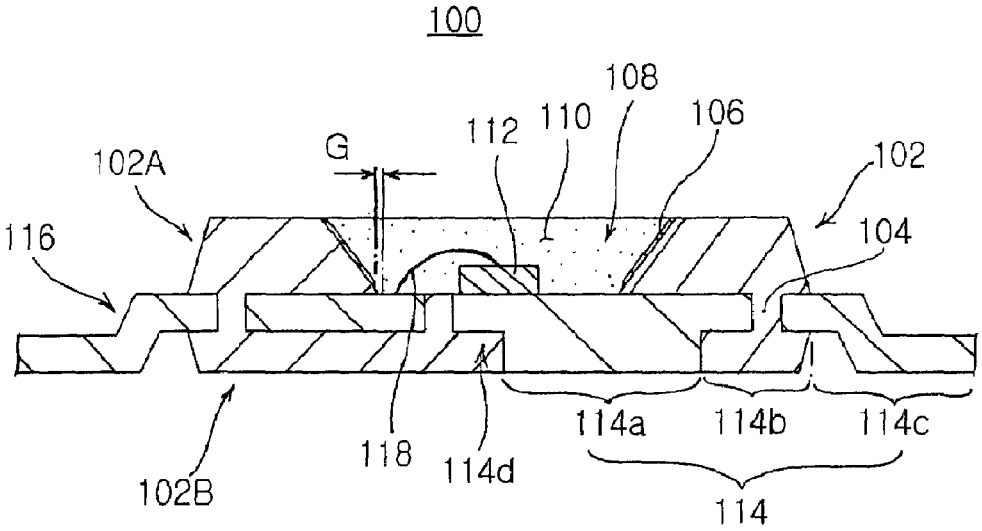
FIG. 8 is a sectional view illustrating another form of the high power LED package as shown in FIG. 4.

FIG. 8 is a sectional view illustrating another form of the high power LED package as shown in FIG. 4.

In the LED package 100 in FIG. 8, the first sheet metal member 114 adjacent to the second sheet metal member 116 has at a part thereof a step 114d, thus to form a T-shaped overall cross section. This step 114d has the following function.

The LED chip 112 may be mal-functioned by moisture, foreign substances and so forth, thus it is important to protect the LED chip from such condition. In addition, because of high temperature accompanied by an operation thereof, repetitive ON/OFF operations or a long time ON operation cause heterogeneous substances such as the metallic sheet metal member and the plastic package body to gradually separate from each other at an interface thereby forming a passageway for the moisture or foreign substances and the like. Thus, in order to improve reliability of products, it is needed to prevent such problem. Preferable one method to do this is to lengthen a way from the outside of the package to the LED chip 112.

In addition, such T shape of the first sheet metal member 114 functions very well to fix the package body 102, like a reinforced concrete structure. That is, it makes the connection between the sheet metal member and the package body 102 more facilitated and strengthened. Accordingly, the finished LED package 100 can endure well against shocks and external force applied thereto.

Figure 9:
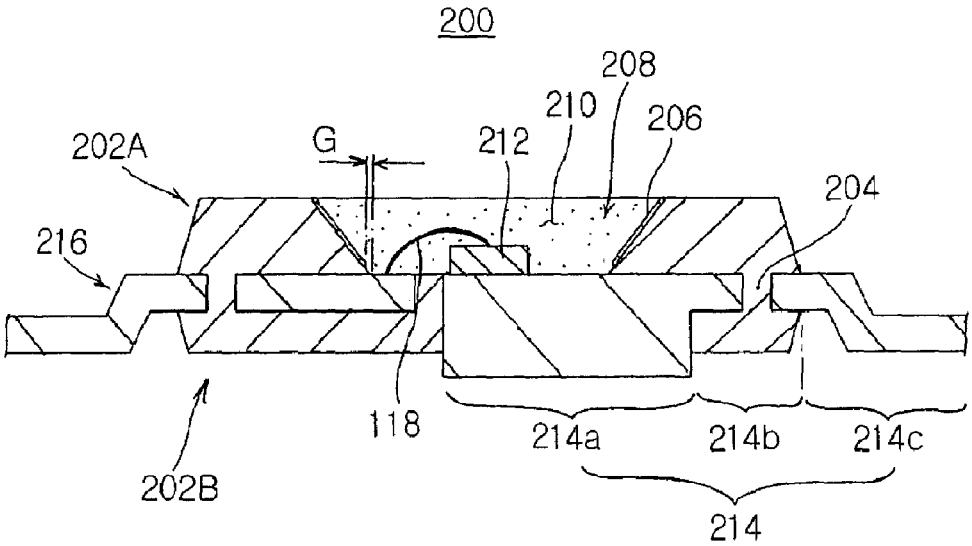
FIG. 9 is a sectional view corresponding to FIG. 4, illustrating a high power LED package according to a second embodiment of the present invention.
Figure 10:
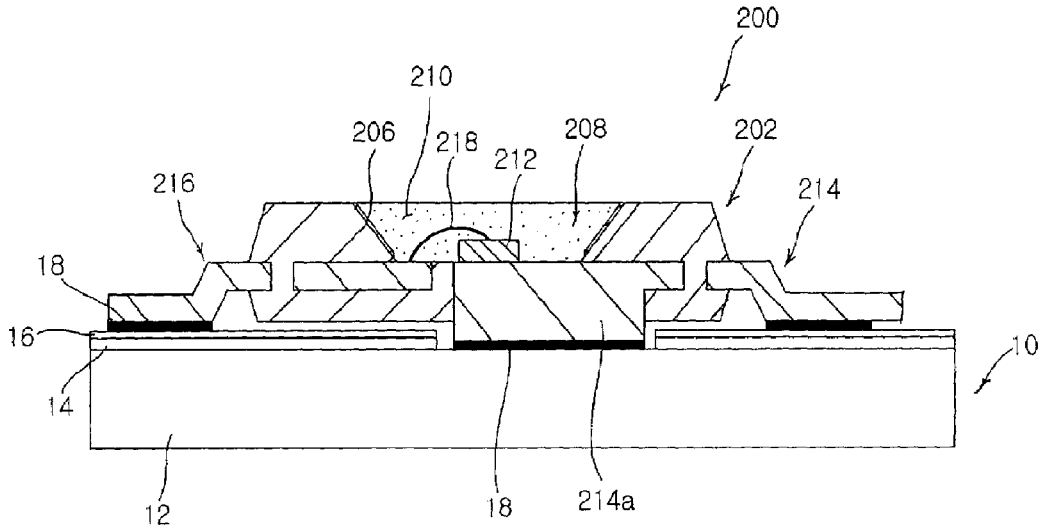
FIG. 10 is a sectional view illustrating a state in which the LED package of FIG. 9 is mounted on a board.

FIG. 9 is a sectional view corresponding to FIG. 4, illustrating a high power LED package according to a second embodiment of the present invention, and FIG. 10 is a sectional view illustrating a state in which the LED package of FIG. 9 is mounted on the board.

Referring first to FIG. 9, the high power LED package 200 of the present embodiment has a construction identical to that of the LED package 100 of the first embodiment, except that a first section 214a of a first sheet metal member 214 is protruded outside from the bottom surface of a package body 202 for a predetermined length. Thus, constitutional elements the same as or similar to those of the LED package 100 are designated with corresponding reference numerals, increased by 100, and detailed description thereof will be omitted.

When the first section 214a of the first sheet metal member of radiating means are protruded from the bottom surface of the package body 202 as such, it is advantageous when mounting the LED package 200 on the board 10 as illustrated in FIG. 10. In detail, the board 10 on which the LED package 200 is mounted includes a metal plate 12 of a heat sink, an insulating layer 14 on the metal plate 12, and a conductive pattern with plural lines 18 printed on the insulating layer 14. When mounting the LED package 200 on the board 10, the third section 214c of the first sheet metal member and a distal end or an outer end of the second sheet metal member functioning as a lead are bonded to the corresponding line 18 of the board 10 by soldering and so forth. As a result, there is an effect in that solder is interposed between the whole LED package 200 and the board 10, so that a distance between the first section of the first sheet metal member and the corresponding portion of the board may be increased. However, since the first section 214a of the first sheet metal member of this embodiment is protruded outside from the bottom surface of the package body 202 for a predetermined length, it is not required to increase the thickness of the solder that is attached between the first section and the corresponding portion of the board. Therefore, it may be possible to maintain a thin thickness in the solder, thereby securing excellent heat transfer effect continuously. Furthermore, depending on the protruded length, a contact between the first section of the first sheet metal member and the corresponding portion of the board can be maintained without forming the solder and the like therebetween, thereby intensifying the effect.

Figure 11:
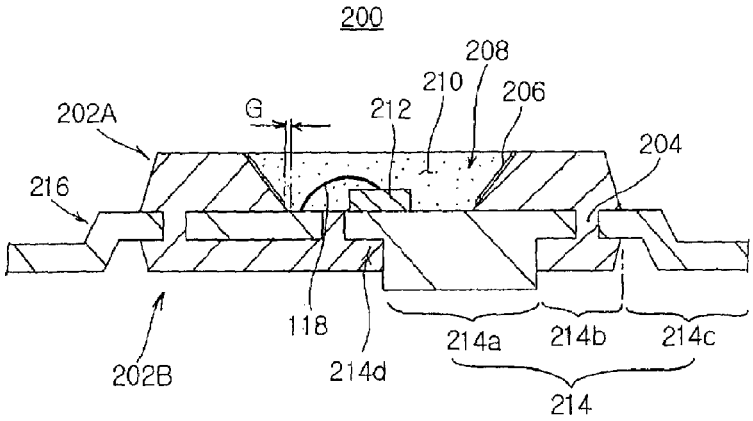
FIG. 11 is a sectional view illustrating a modification to the high power LED package of FIG. 9.

FIG. 11 is a sectional view illustrating a modification to the high power LED package of FIG. 9.

In the LED package 200 in FIG. 11, a part of the first sheet metal member 214 adjacent to the second sheet metal member 216 is formed with a step 214d, so that the first sheet metal member 214 has a T-shaped overall cross-section. Such structure of the LED package 200 is obtained by combining the structure of FIG. 8 with that of FIG. 9. Accordingly, this provides improved heat transfer effect and intensified reliability of the package as well.

Figure 12:
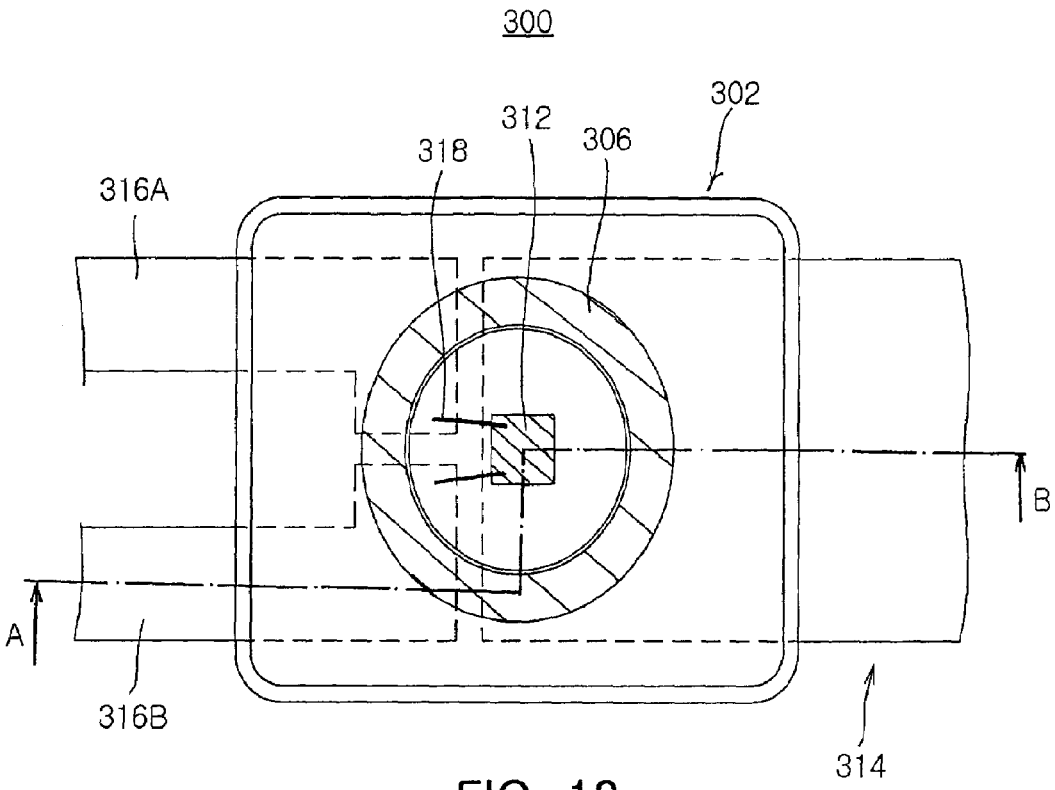
FIG. 12 is a plan view illustrating a high power LED package according to a third embodiment of the present invention.
Figure 13:
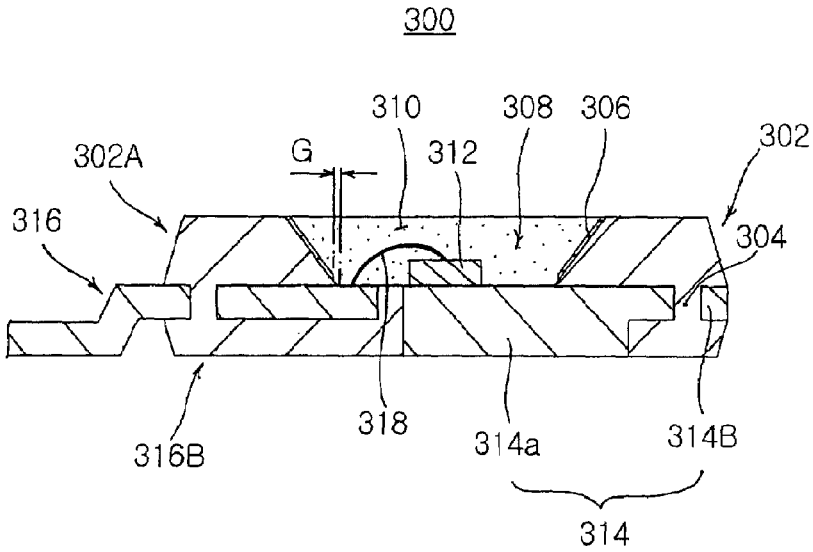
FIG. 13 is a sectional view taken along a line A-B of FIG. 12.
Figure 14:
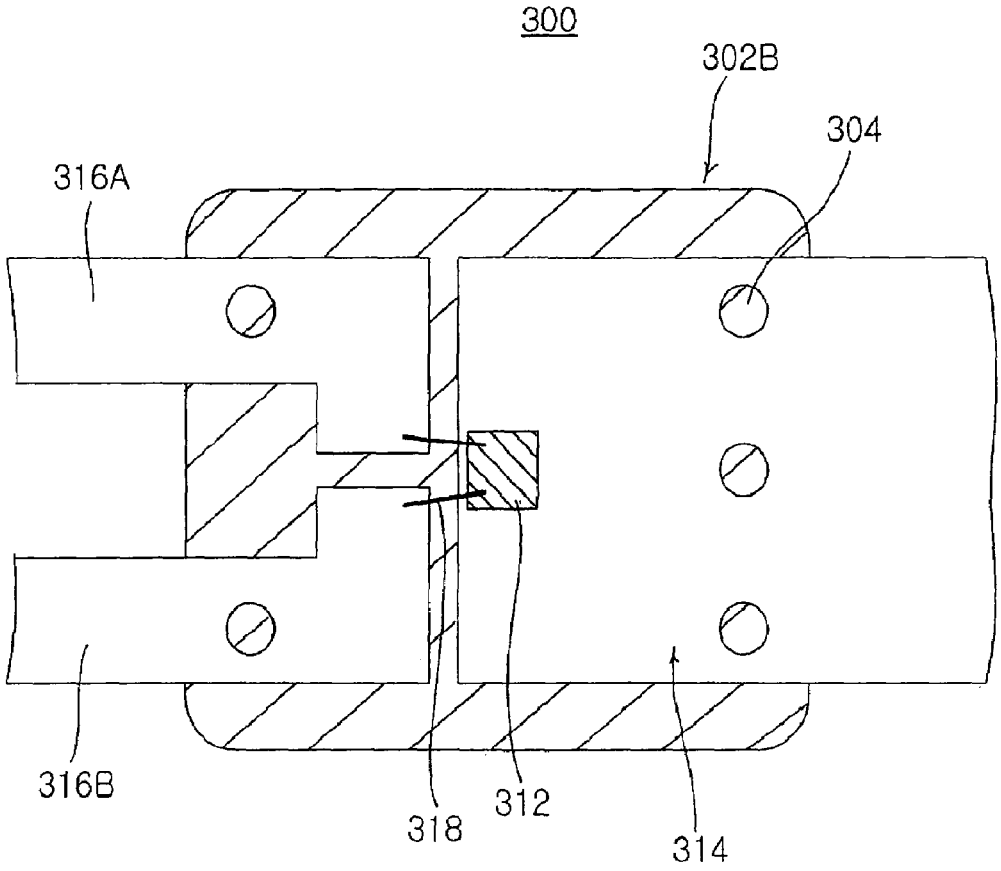
FIG. 14 is a plan view illustrating the high power LED package of FIG. 12 with the upper portion of the package body removed.

FIG. 12 is a plan view illustrating a high power LED package according to a third embodiment of the present invention, FIG. 13 is a sectional view taken along a line B-B of FIG. 10, and FIG. 14 is a plan view illustrating the high power LED package of FIG. 12 with the upper portion of the package body removed.

Referring to FIGS. 12 through 14, the LED package 300 according to the third embodiment is discriminated from the LED package 100 according to the first embodiment, in that a first sheet metal member 314 consists of first and second sections 314a and 314b without protruded beyond the side of a package body 302, and a second sheet metal member 316 consists of first and second terminals 316A and 316B. Thus, constitutional elements the same as or similar to those of the LED package 100 are designated with corresponding reference numerals, increased by 200, and detailed description thereof will be omitted.

According to this embodiment, the first sheet metal member 314 functions as radiating means, the first and second terminals 316A and 316B each serve to electrically connect the LED chip 312 to the power supply through wires 318.

Meanwhile, in the high power LED package 300, the first section 314a of the first sheet metal member may be constructed such that it is protruded outside from the bottom face of the package body 302 as shown in FIGS. 9 and 10.

Figure 15:
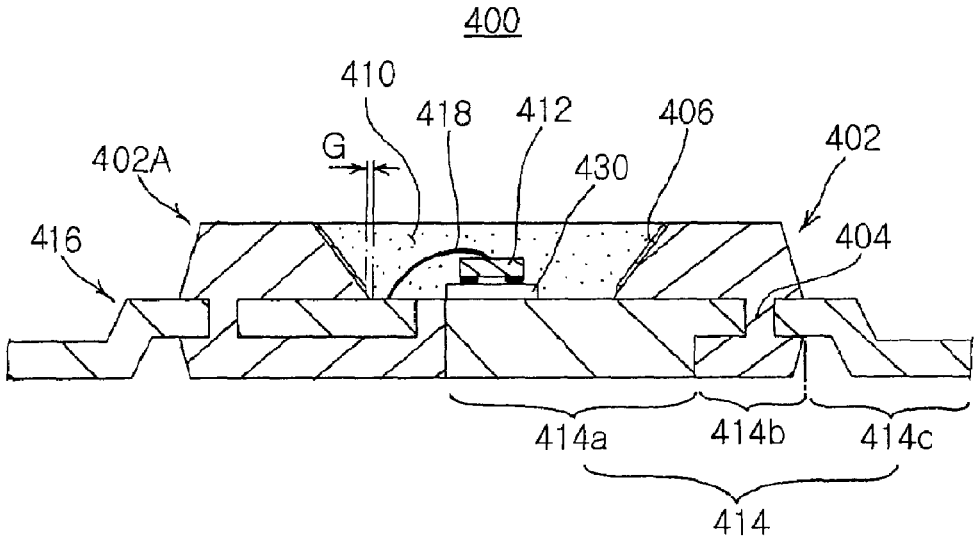
FIG. 15 is a sectional view illustrating a high power LED package according to a fourth embodiment of the present invention.

FIG. 15 is a sectional view illustrating a high power LED package according to a fourth embodiment of the present invention. Referring to FIG. 15, the construction thereof is substantially identical to the construction of FIG. 3, except that an LED chip 412 is bonded onto a submount 430 with a flip chip bonding method, and supported on a first section 414a of a first sheet metal member 414. Thus, constitutional elements the same as or similar to those of the LED package 100 are designated with corresponding reference numerals, increased by 300, and detailed description thereof will be omitted.

The submount 430 comprises a board made of silicon and the like, and thus can properly buffer the LED chip 412 against a shock or distortion of the first sheet metal member 414 and the like. At this time, with the forming of the conductive pattern onto the surface of the submount 430 and the electrical connecting to the first and second sheet metal members 414 and 416 through the wires 418, the LED chip 412 bonded to that pattern with a flip chip bonding method can be electrically connected with the power supply.

Meanwhile, the submount 430 is formed in a size larger than the LED chip 412 seated thereon, and has preferably high thermal conductivity so as to effectively transfer heat generated from the LED chip 412 to the first section 414a of the first sheet metal member below the submount. Specifically, thermal conductivity may be preferably 100 W/m·K or more, more preferably, 200 W/m·K or more. For reference, it is needed that the sheet metal member has thermal conductivity of about 300 W/m·K.

In the meantime, the present embodiment may employ the T-shaped first sheet metal member like in FIG. 8, the protruded first section of the first sheet metal member like in FIG. 9, the protruded T-shaped first sheet metal member like in FIG. 11, and radiating means and the structure of first and second terminals like in FIG. 12.

Figure 16:
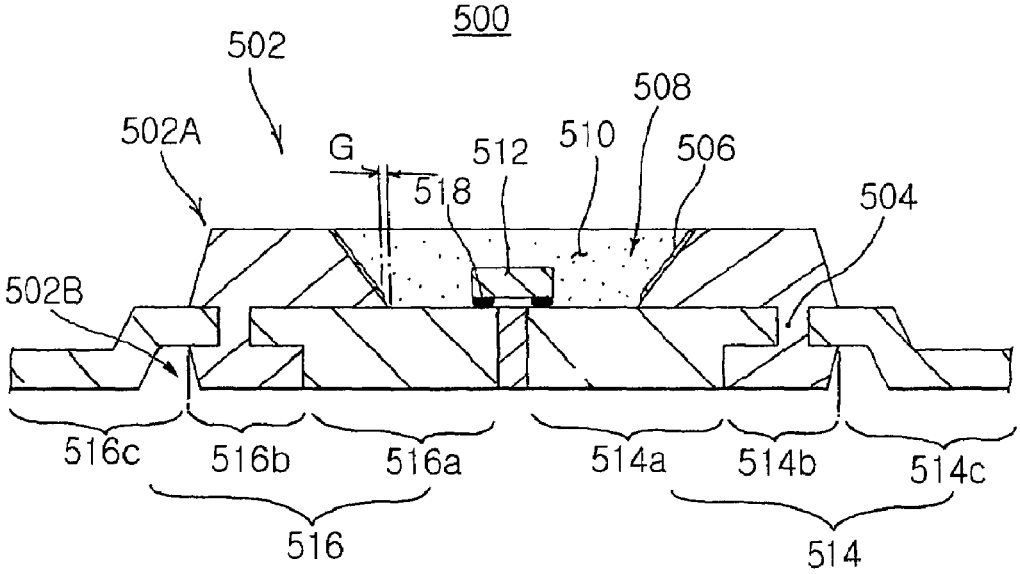
FIG. 16 is a sectional view illustrating a high power LED package according to a fifth embodiment of the present invention.

FIG. 16 is a sectional view illustrating a high power LED package according to a fifth embodiment of the present invention. Referring to FIG. 16, the high power LED package 500 of the present embodiment is different from the LED package 100 of the first embodiment, in that the first sections 514a and 516a as radiating means each are formed at both of the first and second sheet metal members 514 and 516, and the LED chip 512 is connected to these first and second sheet metal members 514 and 516 with the flip chip method. Thus, constitutional elements the same as or similar to those of the LED package 100 are designated with corresponding reference numerals, increased by 400, and detailed description thereof will be omitted.

Structured as such, there is an advantage in that the first sections 514a and 516a as radiating means has an enlarged area thus to transfer heat of the LED chip 512 to the board (not shown) below the construction more effectively.

However, since the both first sections 514a and 516a cannot be electrically connected to the metal plate of the board at the same time, any one of the first sections 514a or 516a should be only thermally connected to the metal plate, but electrically insulated from the same.

Of course, the present embodiment may employ the T-shaped first sheet metal member like in FIG. 8, the protruded first section of the first sheet metal member like in FIG. 9, the protruded T-shaped first sheet metal member like in FIG. 11, and radiating means and the structure of first and second terminals like in FIG. 12.

Figure 17:
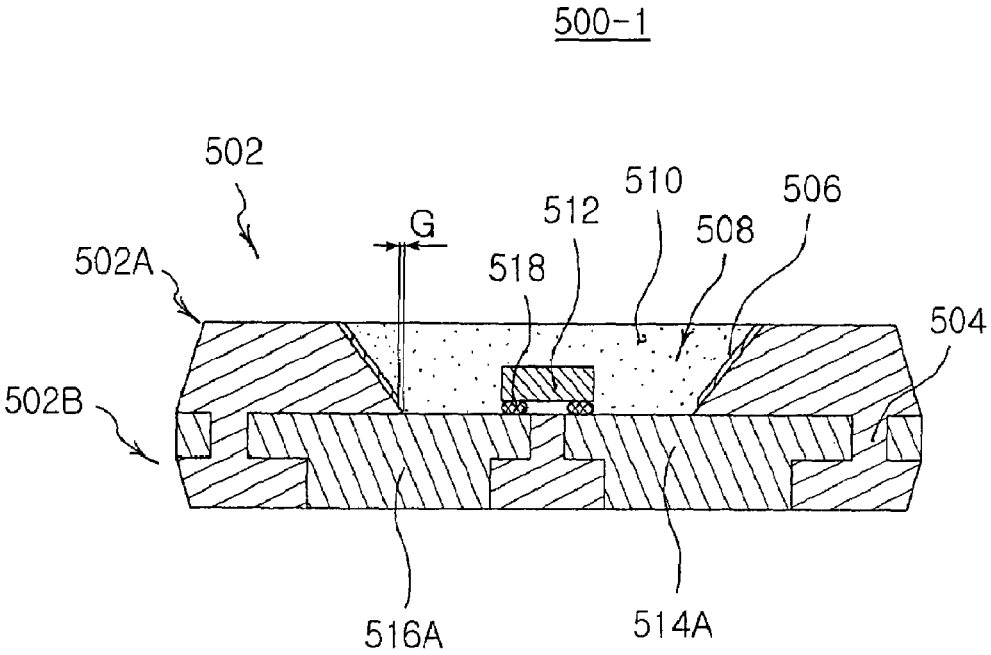
FIG. 17 is a sectional view illustrating a modification to the high power LED package of FIG. 16.

FIG. 17 is a sectional view illustrating a modification to the high power LED package of FIG. 15. Referring to FIG. 17, the high power LED package 500-1 of this embodiment is different from the construction of FIG. 16, in that the first and second sheet metal members 514 and 516 of FIG. 16 are replaced with the generally T-shaped first and second sheet metal members 514A and 516A. Of course, the first and second sheet metal members 514A and 516A may have an inverted L shape or a half T shape like in FIG. 16.

The first sheet metal member 514A may be formed into a T shape via for example etching, by which the lower portion reduced in diameter is exposed from the bottom face 502B of the package body, to form an I/O terminal directly contacting the conductive lines 18 of the board 10 as shown in FIG. 10. Herein, the lower portions of the T-shaped sheet metal members 514A and 516A may be extended from the bottom face 502B of the package body, thereby facilitating the electrical connection with the conductive lines 18.

Meanwhile, the construction of this embodiment may employ the construction of FIG. 15. That is, the LED chip 512 may be electrically connected with the first and second sheet metal members 514A and 516A through the wires 418.

Figure 18:
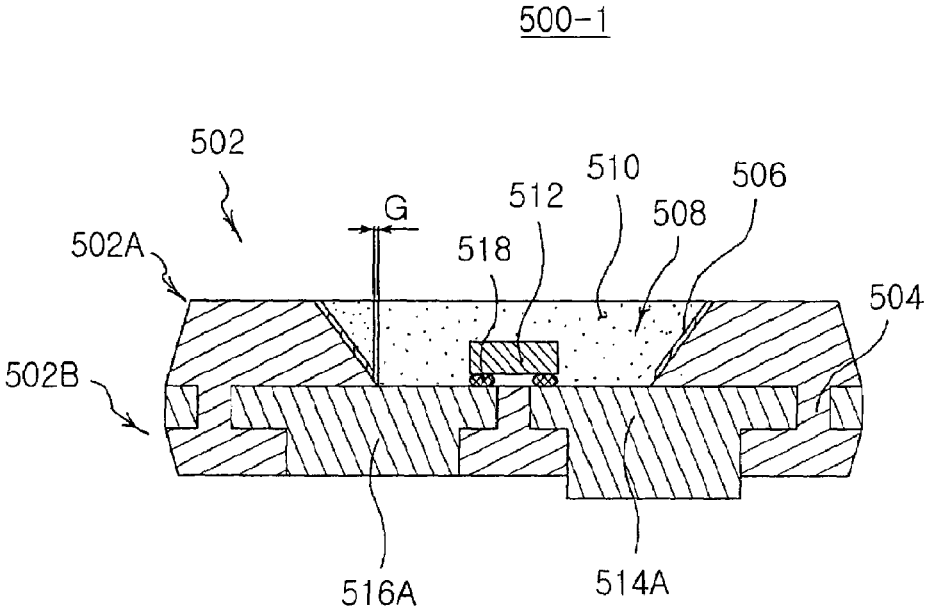
FIG. 18 is a sectional view illustrating another modification to the high power LED package of FIG. 16.

FIG. 18 is a sectional view illustrating another modification to the high power LED package of FIG. 15.

As shown in FIG. 18, by protruding the first sheet metal member 514A downwardly from the package body 502, it is possible to improve reliability and further increase heat transfer effect. In addition, if necessary, it may be constructed to protrude the second sheet metal member 516A like as such.

Figure 19:
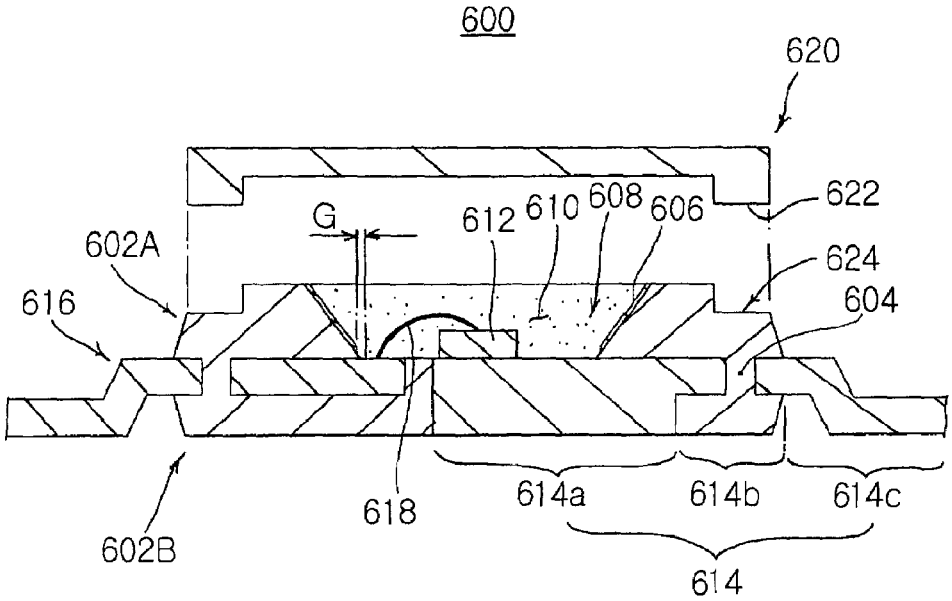
FIG. 19 is a sectional view illustrating a high power LED package according to a sixth embodiment of the present invention.

FIG. 19 is a sectional view illustrating a high power LED package according to a sixth embodiment of the present invention. Referring to FIG. 19, the LED package 600 of the present embodiment has the construction generally identical to that of the LED package 100 of the first embodiment, except that a step 624 for mounting a lens is formed at the upper portion of the package body 602.

By forming such step 624 like this and a flange 622 conforming in shape with the step at the lower portion of the lens 620, it becomes easy to facilitate coupling since the flange 622 and the step 624 are engaged with each other when mounting the lens 620 to the package body 602. This is the case where the lens 620 is separately manufactured and assembled to the package body. However, even in the case where the lens 620 is formed with a transfer forming, the lens forming process is easy and the engaging force therebetween is also intensified.

The present embodiment may also employ the T-shaped first sheet metal member like in FIG. 8, the protruded first section of the first sheet metal member like in FIG. 9, the protruded T-shaped first sheet metal member like in FIG. 11, and radiating means and the structure of first and second terminals like in FIG. 12.

Hereinafter, a manufacturing process of the LED package according to the present invention will be described with reference to the sectional process views of FIGS. 20 through 23. For convenience's sake, as for the LED package adapted to thus process, that of the first embodiment is used.

Figure 20:
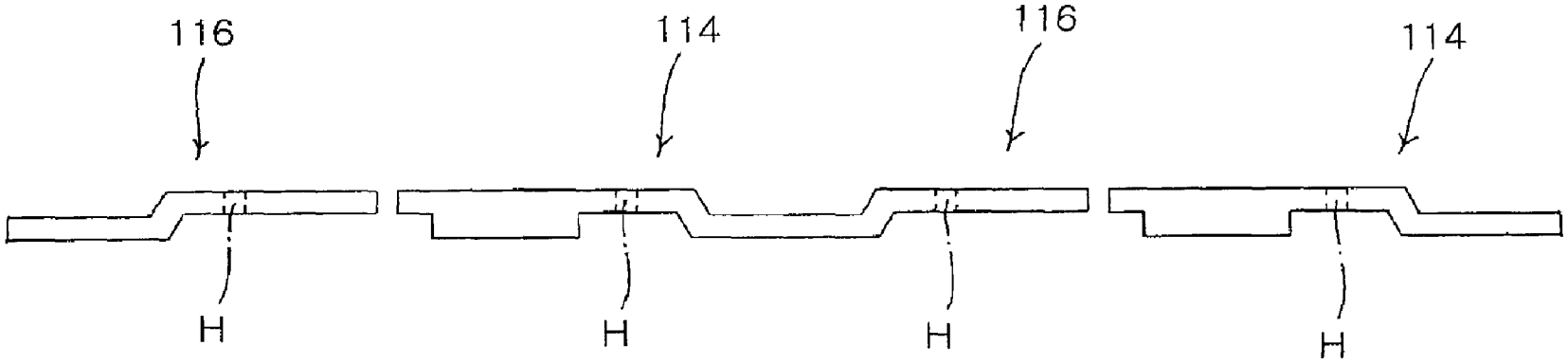
FIGS. 20 through 23 are stepwise sectional views illustrating a manufacturing process of a high power LED package according to the present invention.

First, a step is conducted to dispose a frame where the first and second sheet metal members 114 and 116 are integrally coupled, as shown in FIG. 20. As can be seen from the drawing, holes H are formed vertically through these sheet metal members 114 and 116.

Figure 21:
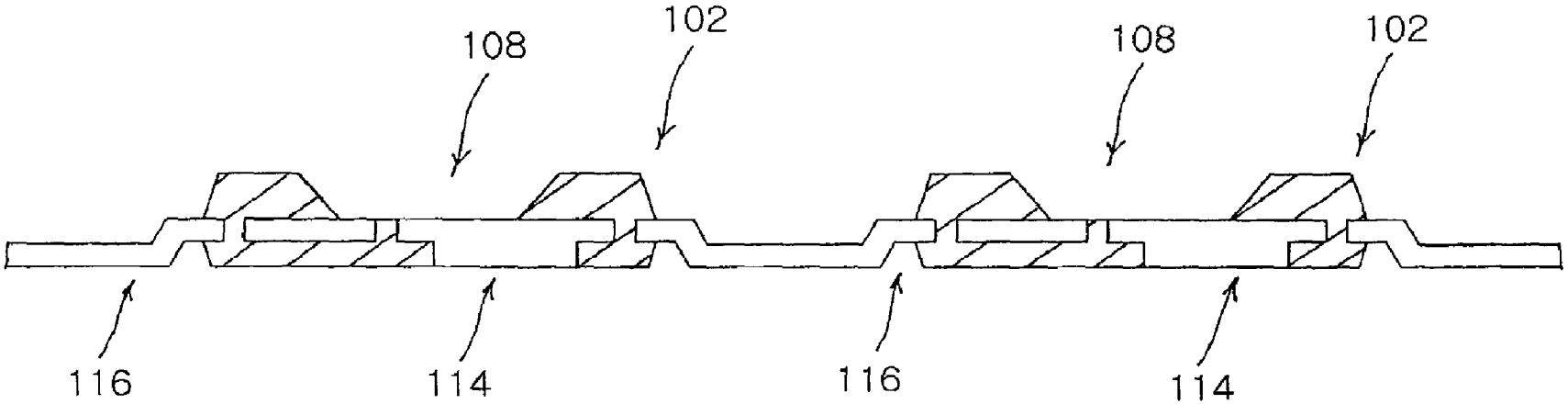

Then, as shown in FIG. 21, a step is conducted to form the package body 102 at a position predetermined by the injection molding. Herein, resin forming the package body 102 is poured into the holes H and cured to form the posts 104 (see FIGS. 4 and 5) as described before.

Figure 22:
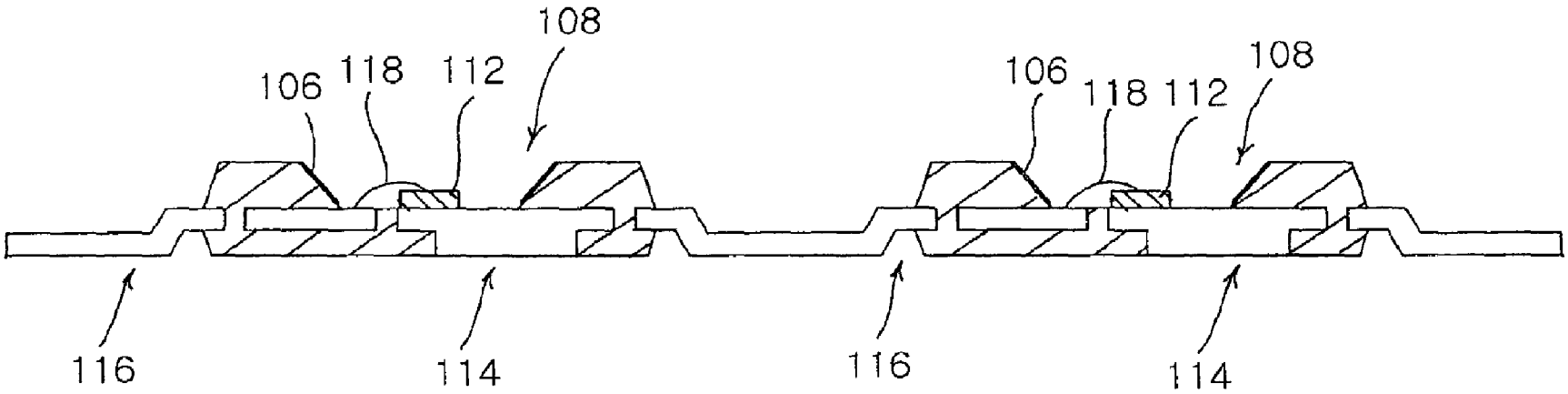

Next, as shown in FIG. 22, a step is conducted to form the reflective layer 106 onto the inner wall of the recess 108 of the package body 102, to seat the LED chip 112 on the first section of the first sheet metal member 114, and to electrically connect the first and second sheet metal members 114 and 116 with the power supply through the wires 118.

Figure 23:
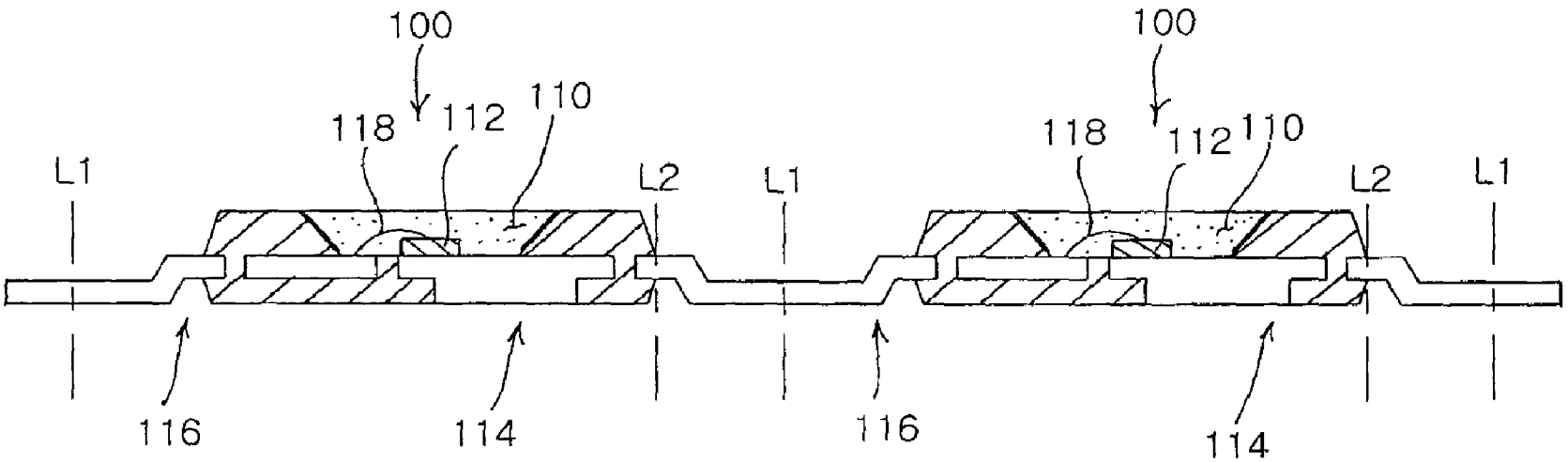

Then, as shown in FIG. 23, a step is conducted to fill up the recess 108 with the sealant 110 to seal the LED chip 112 and the like therein. Next, a step is conducted to cut the first and second sheet metal members 114 and 116 in frame shape to obtain the LED package 100 like in FIG. 4.

For reference, in manufacturing the LED package 300 like in FIG. 13, two one-dot chain lines L1 and L2 are cut together.

Figure 24:
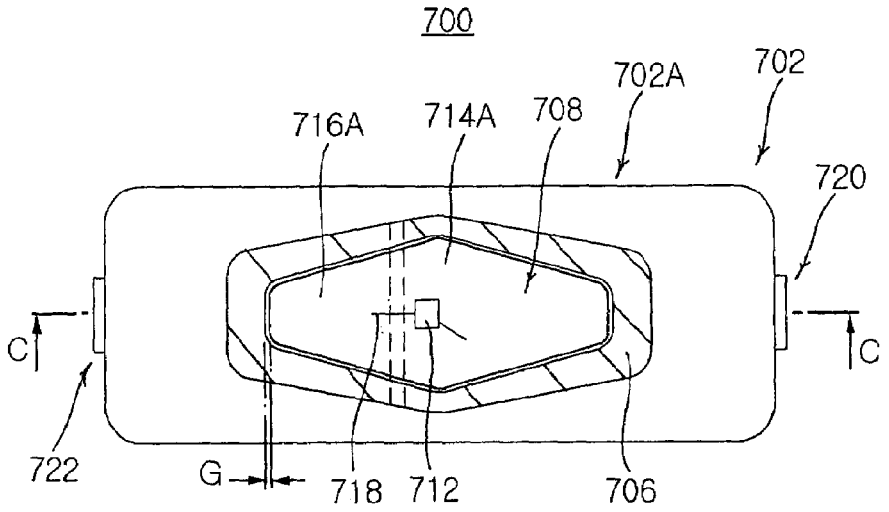
FIG. 24 is a plan view illustrating a high power LED package according to a seventh embodiment of the present invention.

Hereinafter, an LED package according to a seventh embodiment of the present invention will be described with reference to FIGS. 24 through 26. FIG. 24 is a plan view illustrating the high power LED package according to the seventh embodiment of the present invention, FIG. 25 is a sectional view taken along a line C-C of the LED package of FIG. 24, and FIG. 26 is a bottom view of the LED package of FIG. 24.

The high power LED package 700 of the present embodiment is used mounted on a board (see FIG. 10) having a metal plate of a heat sink. an insulating layer on the metal plate and a conductive pattern printed with plural pattern lines on the insulating layer.

Figure 25:
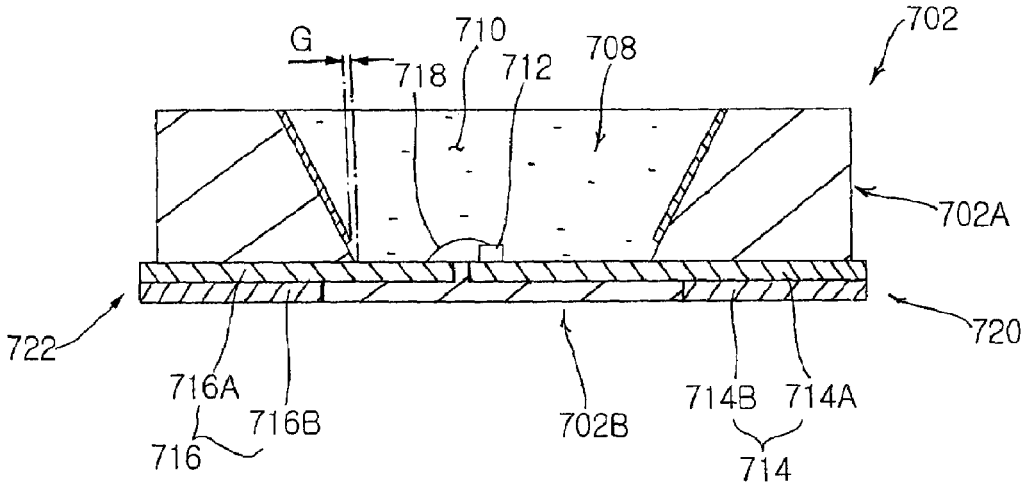
FIG. 25 is a sectional view taken along a line C-C of the LED package of FIG. 24.
Figure 26:
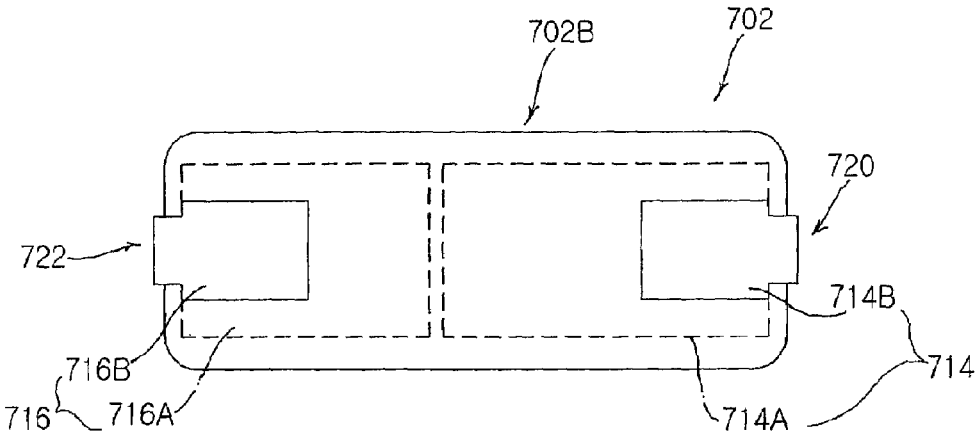
FIG. 26 is a bottom view of the LED package of FIG. 24.

As shown in FIGS. 24 through 26, the high power LED package 700 includes an LED chip 712 for emitting light when applied with electric current, a package body 702 integrally formed with resin to have a recess 708 for receiving the LED chip 712, first and second sheet metal members 714 and 716 positioned in the package body 702, functioning as a terminal and radiating means while supporting the LED chip 712, and a sealant 710 for sealingly filling up the recess 708.

First, the package body 702 is formed by injection molding of resin such that the upper surface of the upper portion 702A thereof is sunk toward its center portion, forming the recess 708. Herein, the inner wall of the recess 708 is preferably formed to have a certain slant. A lower portion 702B of the package body receives the first and second sheet metal members 714 and 716 together with the upper portion 702A of the package body. Herein, as shown in FIG. 22, the upper and lower portions 702A and 702B of the package body are connected with each other at their both longitudinal edges to stably fix the first and second sheet metal members 714 and 716 therebetween. In addition, although not illustrated, by forming a hole to each of the first sections 714A and 716A and connecting the upper and lower portions 702A and 702B of the package body together through the holes, it is possible to fix the first and second sheet metal members 714 and 716 more stably.

The first sheet metal member 714 consists of first and second sections 714A and 714B overlapped vertically and combined in a half T shape, the first and second sections 714A and 714B having a width smaller than the package body 702. The first and second sections 714A and 714B are attached to each other with conductive epoxy and the like having high thermal and electric conductivity, rendering the current and heat transfer therebetween conducted smoothly. The first section 714A supports at one end the LED chip 712 in the recess 708 while being electrically connected thereto, and extends at the other end over the sidewall of the package body 702. The second section 714B is exposed at its bottom surface from the bottom face of the lower portion 702B of the package body, and extends at one end (positioned at right side in the drawing) over the sidewall of the package body thus to form a protrusion together with the other end of the first section 714A. Meanwhile, the second section 714B is formed shorter than the first section 714A such that generally half portion thereof adjacent to the LED chip 712 on the first section 714A is completely surrounded and fixed by the package body 702.

The second sheet metal member 716 has a mirror image shape to the first sheet metal member 714, and consists of the first and second sections 716A and 716B, whose width is formed smaller than the package body 702. The first and second sections 716A and 716B are attached to each other with conductive epoxy and the like having high thermal and electric conductivity, rendering the current and heat transfer therebetween conducted smoothly. The first section 716A is at one end positioned adjacent to the LED chip 712 in the recess 708 as to be electrically connected thereto, and extends at the other end over the sidewall of the package body 702. The second section 716B is exposed at its bottom surface from the bottom face of the lower portion 702B of the package body, and extends at one end (positioned at left side in the drawing) over the sidewall of the package body thus to form a protrusion together with the other end of the first section 716A. Meanwhile, the second section 716B is formed shorter than the first section 716A such that generally half portion thereof adjacent to the LED chip 712 on the first section 716A is completely surrounded and fixed by the package body 702.

As a result, heat generated at the LED chip 712 can be transferred smoothly through the first and second sections 714A and 714B of the first sheet metal member 714 to the metal plate of the board. That is, it can be understood that in the present invention, the first sheet metal member 714 may function as radiating means. Herein, since the first section 714A of the first sheet metal member 714, radiating means, is a part of the sheet metal member, a thickness thereof is seriously reduced relative to the metal slug 3 (see FIGS. 1 and 2) of the prior art. It can be accordingly seen that a heat transfer path from the LED chip 712 to the metal plate below the first section is greatly reduced, thereby increasing thermal radiation efficiency considerably. In addition, since the second sheet metal member 716 also functions as radiating means as well, thermal radiation efficiency may be further increased.

Furthermore, the first sheet metal member 714 has the half T shape, so that a path of foreign substances, moisture and the like intruded from the lower portion 702B of the package body into the package body becomes longer to improve reliability of the LED package 700.

The other elements of this embodiment are substantially identical to those of the LED package 100 of the first embodiment, and thus the detailed description thereof will be omitted.

Figure 27:
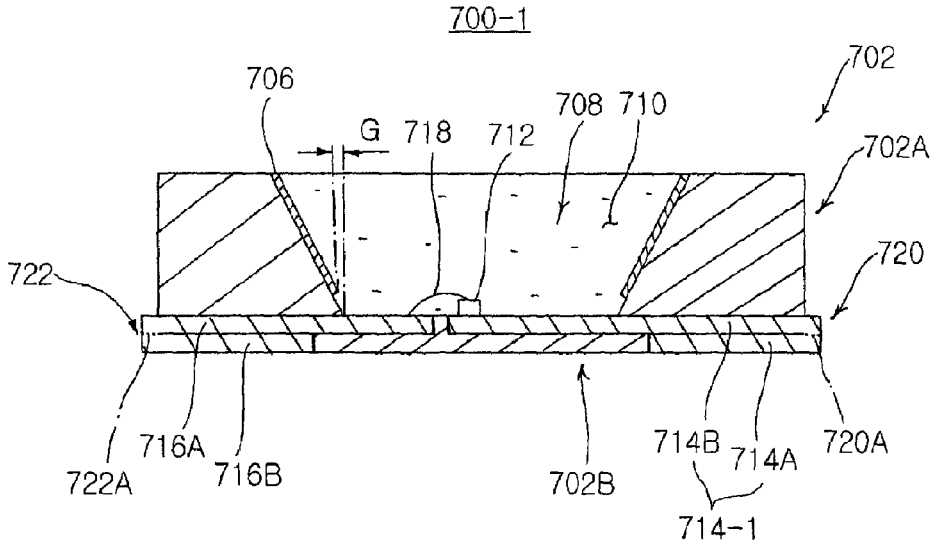
FIG. 27 is a sectional view illustrating a modification to the high power LED package according to the seventh embodiment of the present invention.

FIG. 27 is a sectional view illustrating a modification to the high power LED package according to the seventh embodiment of the present invention. An LED package 700-1 of this embodiment has substantially the same construction as the LED package 700 of the seventh embodiment, except that a first sheet metal member 714-1 consists of first and second sections 714A and 714B folded up on each other through bending at a bent 720A, and a second sheet metal member 716-1 consists of first and second sections 716A and 716B folded up on each other through bending at a bent 720B. Thus, the detailed description for the other elements will be omitted.

Figure 28:
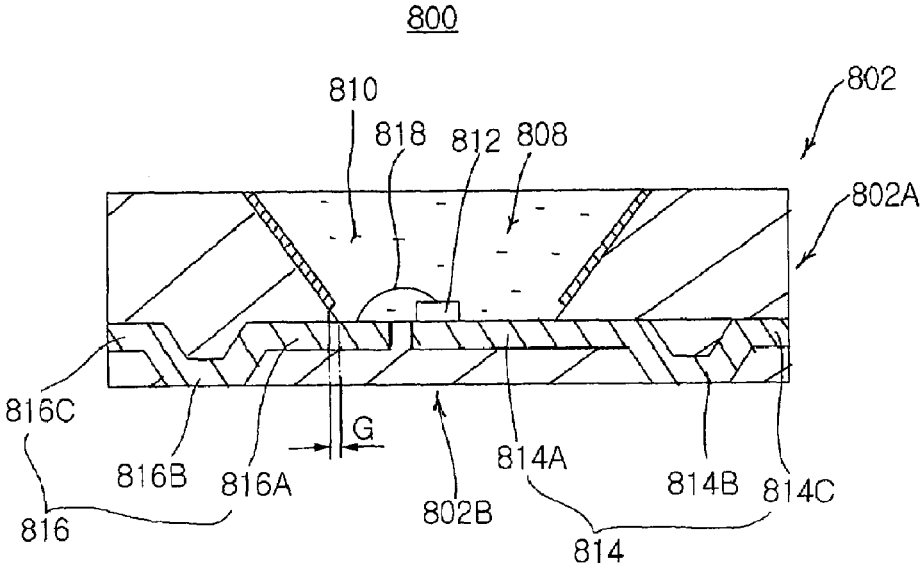
FIG. 28 is a sectional view illustrating a high power LED package according to an eighth embodiment of the present invention.

FIG. 28 is a sectional view illustrating a high power LED package according to an eighth embodiment of the present invention. Referring to FIG. 8, the high power LED package 800 of the eighth embodiment is substantially identical to the construction of LED package 700 of the seventh embodiment, except for the first and second sheet metal members 814 and 816.

That is, the first sheet metal member 814 is formed such that the second section 814B thereof is bent downward to the first and third sections 814A and 814C thereof, exposing itself through the bottom face of the lower portion 802B of the package body, and the third section 814C is exposed through the sidewall of the package body 802. Also, the second sheet metal member 816 is formed such that the second section 816B thereof is bent downwardly to the first and third sections 816A and 816C thereof, being exposed through the bottom face of the lower portion 802B of the package body, and the third section 816C is exposed through the sidewall of the package body 802.

Such shape of the sheet metal members 814 and 816 can be obtained by bending a certain portion of the source sheet metal plate, the second sections 814B and 816B, by means of a press and the like. In addition, on the contrary, such shape can be formed by selective etching and the like of the source sheet metal plate.

As a result, heat generated at the LED chip 812 can be transferred smoothly through the first and second section 814A and 814B of the first sheet metal member 814 to the metal plate of the board. That is, it can be understood that in the present invention, the first sheet metal member 814 may function as radiating means. Herein, since the first section 814A of the first sheet metal member 814 as radiating means is a part of the sheet metal member, the thickness thereof is seriously reduced relative to the metal slug 3 (see FIGS. 1 and 2) of the prior art. It can be accordingly seen that a heat transfer path from the LED chip 812 to the metal plate below the first section is greatly reduced, thereby increasing thermal radiation efficiency considerably. In addition, since the second sheet metal member 816 also functions as radiating means as well, thermal radiation efficiency may be further increased.

In addition, when exposing the terminals in downset manner from the first and second sheet metal members 814 and 816, the bent sheet metal members 814 and 816 operates like reinforced concrete structure, rendering the connection with the package body 802 more effective and intensified. Further, like the T shaped or half T-shaped sheet metal member structure as mentioned before, a path of foreign substances, moisture and the like intruded from the bottom face of the lower portion 802B of the package body into the body through a gap (that may be formed later) between the sheet metal members 814 and 816 and the package resin becomes longer and complicated to improve reliability of the LED package.

Figure 29:
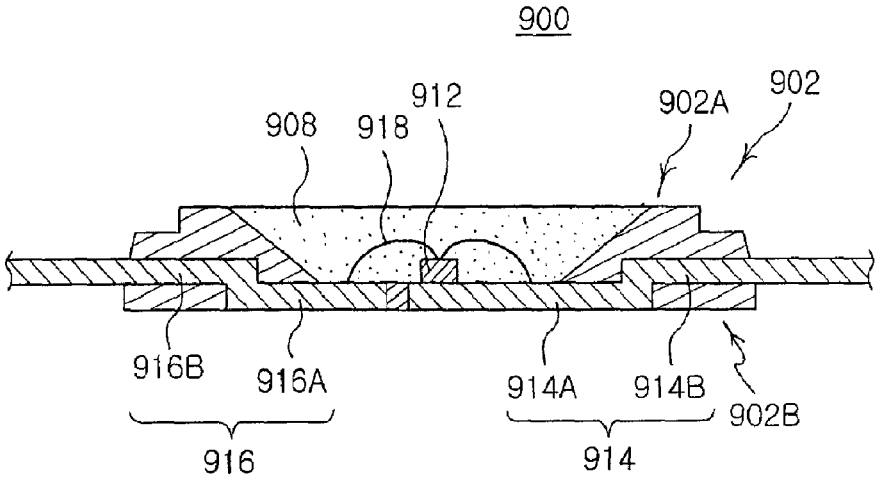
FIG. 29 is a sectional view illustrating a high power LED package according to a ninth embodiment of the present invention.

FIG. 29 is a sectional view illustrating a high power LED package according to a ninth embodiment of the present invention. Referring to FIG. 29, the high power LED package 900 according to the ninth embodiment has the cross-sectional shape similar to the LED package 800 of the eighth embodiment in FIG. 28, but has the construction of the first and second sheet metal members 914 and 916 deformed from that of the eighth embodiment.

That is, the first sheet metal member 914 includes the first and second sections 914A and 914B. The first section 914A supports at its upper surface the LED chip 912 in the package body 902, and is exposed at its lower surface outside via the lower portion 902B of the package body. The second section 914B is formed stepped upwards and extends to the outside between the lower portion 902B and the upper portion 902A of the package body. Meanwhile, the second sheet metal member 916 includes first and second sections 916A and 916B. The first section 916A is spaced apart for a predetermined distance from the first section 914A of the first sheet metal member 914, and is exposed at its lower surface to the outside via the lower portion 902B of the package body. The second section 916B is formed stepped upwards from the first section 916A and extends to the outside between the lower portion 902B and the upper portion 902A of the package body to form a terminal.

Such a shape of the sheet metal members 914 and 916 can be obtained by bending the sheet metal source plate between the first and second sections 914A and 914B; 916A and 916B with a press and the like, or selectively etching the same.

Constructed as such, heat generated from the LED chip 912 can be smoothly transferred through the first section 914A of the first sheet metal member 914 to the metal plate of the board like in FIG. 9, and a height of the whole package body 902 can be additionally reduced as well.

Furthermore, because of the simplified construction relative to the embodiments as mentioned before, it is possible to enable the manufacturing process to be simplified and automated.

Figure 30:
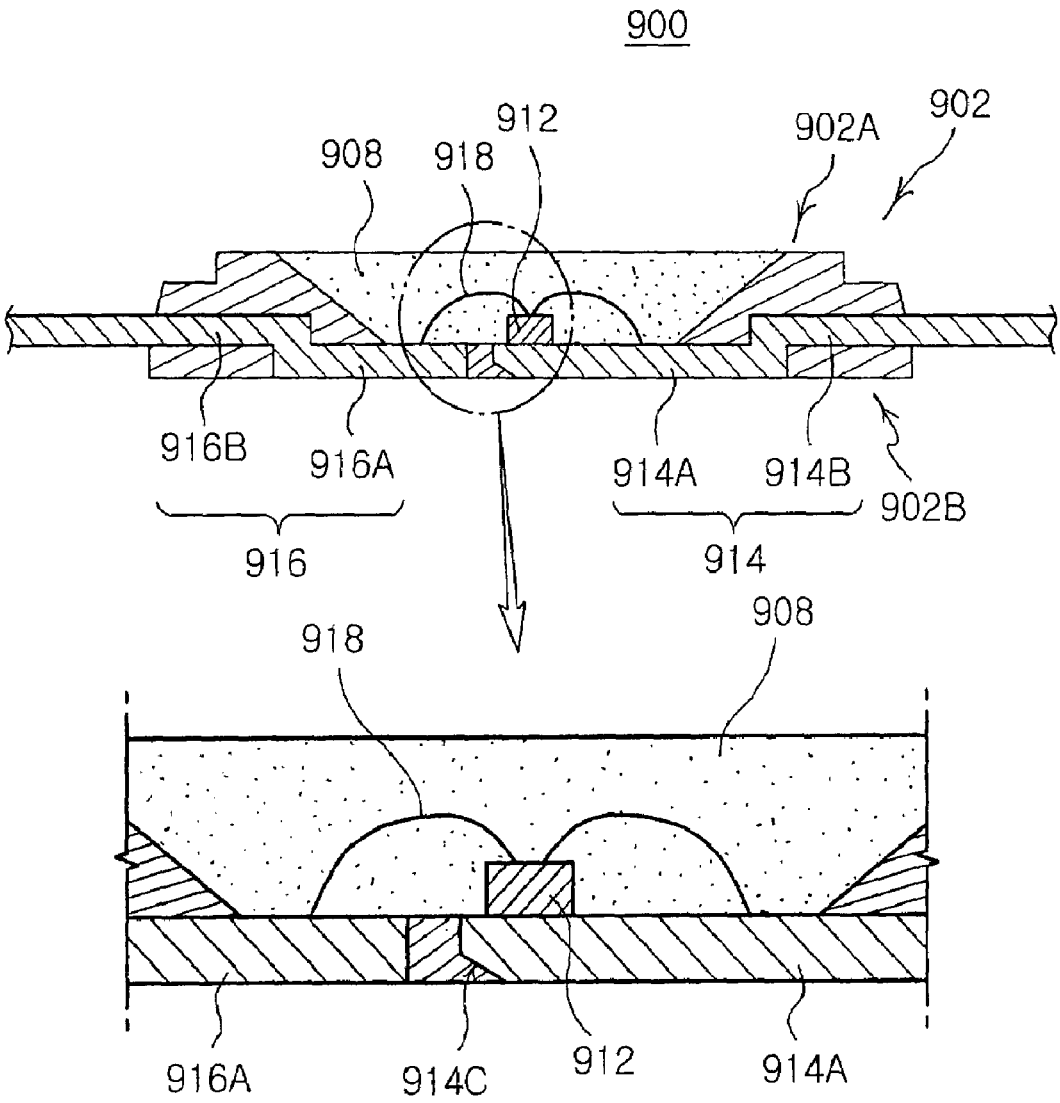
FIG. 30 is a sectional view illustrating a modification to the high power LED package of FIG. 29.

FIG. 30 is a sectional view illustrating a modification to the high power LED package of FIG. 29.

Referring to FIG. 30, the lower portion at one end of the first section 914A of the first sheet metal member 914 forms a slant surface 914C cut slantly in a direction opposite to the first section 916A of the second sheet metal member.

Similarly to for example the step 114d illustrated in FIG. 8, the slant surface 914C makes the path of foreign substances and moisture intruded into the LED chip 912 longer and complicated. In addition, the slant surface 914C is covered with resin of the package body 902, to improve the connection and air-tight feature between the first sheet metal member 914 and the package body 902. Further, instead of this slant surface 914C, the step 114d as in FIG. 8 may be employed.

Furthermore, it may be also possible to form the slant surface 914C or the step 114d in FIG. 8 to the second sheet metal member 916.

As described before, the high power LED package of the present invention is constructed to form radiating means for transferring heat generated from the LED chip to the metal plate of the board into the sheet metal member, thereby improving thermal radiation efficiency and reducing the size and thickness thereof.

In addition, by securing effective radiating means using the sheet metal member and injection-molding the package body with resin, the high power LED package of the present invention can be easily manufactured into a simple product.

Furthermore, by fixedly wrapping the sheet metal member functioning as radiating means and terminal in the package body of resin, the high power LED package of the present invention can be provided thin and robust.

While the present invention has been shown and described in connection with the preferred embodiments, it will be apparent to those skilled in the art that modifications and variations can be made without departing from the spirit and scope of the invention as defined by the appended claims.

What is claimed is:

[1. A high power Light Emitting Diode (LED) package mounted on a board, which includes a metal plate of a heat sink, an insulating layer on the metal plate and a conductive pattern printed with plural pattern lines on the insulating layer, the high power LED package comprising:

an LED chip;

a package body integrally formed with resin to have a recess for receiving the LED chip;

a first sheet metal member electrically connected with the LED chip while supporting the LED chip at its upper partial portion in the recess, the first sheet metal member surrounded by the package body and extending to the side face of the package body, the first sheet metal member having a heat transfer section for transferring heat generated from the LED chip to the metal plate of the board and extending downward from the inside of the package body so that a lower end thereof is exposed at a bottom face of the package body thus to contact the board;

a second sheet metal member electrically connected with the LED chip spaced apart from the first sheet metal member for a predetermined gap, the second sheet metal member extending through the inside of the package body to the side face of the package body in a direction opposite to the first sheet metal member; and a transparent sealant sealingly filled up into the recess.]

[2. The high power LED package according to claim 1, wherein the heat transfer section of the first sheet metal member is protruded downward from the bottom face of the package body.]

[3. The high power LED package according to claim 1, wherein the first and second sheet metal members each have at least one hole, and the package body has a plurality of connecting posts that are integrally formed and connected with the upper and lower portions of the package body through the holes.]

[4. The high power LED package according to claim 1, wherein the first sheet metal member is contacted with one electrode of the LED chip, and further has an external terminal integrally formed therewith to extend over the outside of the package body thereby contacting one pattern line of the board, and wherein the second sheet metal member is connected at one end of the recess-side with the other electrode of the LED chip and extended at the other end of the recess-side out of the package body, thereby contacting the other pattern line of the board.]

[5. The high power LED package according to claim 1, wherein the second sheet metal member is divided into a pair of first and second terminals insulated from each other, in which the first terminal is connected at one end with one electrode of the LED chip and extended at the other end out of the package body, thereby contacting one pattern line of the board, and wherein the second terminal is connected at one end with the other electrode of the LED chip and extended at the other end over the outside of the package body, thereby being contacting the other pattern line of the board.]

[6. The high power LED package according to claim 1, wherein the heat transfer section of the first sheet metal member has a T-shaped cross section and extends downwardly.]

[7. The high power LED package according to claim 1, wherein the heat transfer section of the first sheet metal member is formed such that its lower end facing the second sheet metal member is cut at a slant away from the second sheet metal member and the cut portion of the heat transfer section is covered with the package body.]

[8. The high power LED package according to claim 1, wherein the second sheet metal member has a structure symmetrical to the first sheet metal member.]

[9. The high power LED package according to claim 8, wherein the first and second sheet metal members are connected at their lower portion with pattern lines of the board.]

[10. The high power LED package according to claim 1, further comprising a high reflectivity reflective layer coated on the inner surface of the recess.]

[11. The high power LED package according to claim 1, further comprising a lens assembled onto the upper surface of the package body, and wherein the package body has a step at its upper edge so as to be engaged with the lower portion of the lens.]

[12. A high power Light Emitting Diode (LED) package mounted on a board, which includes a metal plate of a heat sink, an insulating layer on the metal plate and a conductive pattern printed with plural pattern lines on the insulating layer, the high power LED package comprising:

an LED chip;

a package body integrally formed with resin to have a recess for receiving the LED chip;

a half T-shaped first sheet metal member electrically connected with the LED chip while supporting the LED chip at its upper partial portion in the recess, the first sheet metal member surrounded by the package body and extending to the side face of the package body, wherein the first sheet metal member has an upper section electrically connected at one end with the LED chip and a lower section overlapped on the lower portion of the upper section, the bottom surface of the lower section being exposed through the bottom face of the package body to contact the board;

a second sheet metal member electrically connected with the LED chip spaced apart from the first sheet metal member for a predetermined gap, the second sheet metal member extending through the inside of the package body to the side face of the package body in a direction opposite to the first sheet metal member; and a transparent sealant sealingly filled up into the recess.]

[13. The high power LED package according to claim 12, wherein the upper and lower sections of the first sheet metal member are bonded together with conductive epoxy with high thermal and electric conductivities.]

[14. The high power LED package according to claim 12, wherein the first sheet metal member is folded up at the other end that is exposed through the package body side so that the upper and lower sections thereof are overlapped vertically on each other.]

[15. The high power LED package according to claim 12, wherein the other ends of the first and second sheet metal members are protruded from a sidewall of the package body.]

[16. The high power LED package according to claim 12, wherein the second sheet metal member has a structure symmetrical to that of the first sheet metal member.]

[17. The high power LED package according to claim 12, wherein the first and second sheet metal members are protruded at their lower ends downwardly from the bottom face of the package body.]

[18. The high power LED package according to claim 12, further comprising a high reflectivity reflective layer coated on the inner surface of the recess.]

[19. The high power LED package according to claim 12, further comprising a lens assembled onto the upper surface of the package body, and wherein the package body has a step at its upper edge so as to be engaged with the lower portion of the lens.]

[20. A high power Light Emitting Diode (LED) package mounted on a board, which includes a metal plate of a heat sink, an insulating layer on the metal plate and a conductive pattern printed with plural pattern lines on the insulating layer, the high power LED package comprising:

an LED chip;

a package body integrally formed with resin to have a recess for receiving the LED chip;

a first sheet metal member electrically connected with the LED chip while supporting the LED chip at its upper partial portion in the recess, the first sheet metal member surrounded by the package body and extending to the side face of the package body, with a partial bottom surface of the first sheet metal member bent downward to be exposed through the bottom face of the package body and to contact the conductive pattern of the board;

a second sheet metal member electrically connected with the LED chip spaced apart from the first sheet metal member for a predetermined gap, the second sheet metal member extending through the inside of the package body to the side face of the package body in a direction opposite to the first sheet metal member; and a transparent sealant sealingly filled up into the recess.]

[21. The high power LED package according to claim 20, wherein the bent shape of the first sheet metal member is formed by etching or press working of a source sheet metal.]

[22. The high power LED package according to claim 20, wherein a lower portion of the first sheet metal member is exposed at a middle portion in length through the bottom face of the package body.]

[23. The high power LED package according to claim 22, wherein the exposed lower portion of the first sheet metal member is extended out of the bottom face of the package body.]

[24. The high power LED package according to claim 20, wherein the first sheet metal member is exposed at the lower portion adjacent to one end thereof through the bottom face of the package body to contact the board.]

[25. The high power LED package according to claim 20, wherein the other end of the first sheet metal member is protruded out of a sidewall of the package body.]

[26. The high power LED package according to claim 20, wherein the bottom surface of the first sheet metal member adjacent to one side thereof is cut at a slant away from the second sheet metal member, and the cut portion of the heat transfer section is covered with the package body.]

[27. The high power LED package according to claim 20, wherein the second sheet metal member has a structure symmetrical to that of the first sheet metal member.]

[28. The high power LED package according to claim 20, further comprising a high reflectivity reflective layer coated on the inner surface of the recess.]

[29. The high power LED package according to claim 20, further comprising a lens assembled onto the upper surface of the package body, and wherein the package body has a step at its upper edge so as to be engaged with the lower portion of the lens.]

*30. A manufacturing method of a high power LED package comprising:*

*preparing a frame comprising*

*a first sheet metal member formed as a single body having a first section and a second section, the first section defining a heat transfer section, and*

*a second sheet metal member;*

*forming a package body having a recess exposing an upper surface of the heat transfer section of the first sheet metal member, and surrounding the first sheet metal member and the second sheet metal member, wherein*

*the second section of the first sheet metal member is extended to a side face of the package body, and*

*the heat transfer section is extended downwardly from the inside of the package body so that a lower edge of the heat transfer section is exposed at a bottom face of the package body;*

*disposing an LED chip in the recess to be supported by the heat transfer section and electrically connected to the frame; and*

*filling the recess with a transparent sealant to seal the LED chip wherein the first sheet metal member is formed to be in contact with one electrode of the LED chip, and the first sheet metal member further has a third section defining an external terminal integrally formed with the single body of the first sheet metal member and extending to the outside of the package body.*

*31. The manufacturing method of the high power LED package according to claim 30, wherein the second sheet metal member is formed to be spaced apart from the first sheet metal member by a predetermined gap, and extended through the inside of the package body to the side face of the package body.*

*32. The manufacturing method of the high power LED package according to claim 30, wherein the heat transfer section of the first sheet metal member is formed to be protruded downwardly from and beyond the bottom face of the package body.*

*33. The manufacturing method of the high power LED package according to claim 30, further comprising:*

*forming at least one hole penetrating the first sheet metal member and the second sheet metal member.*

*34. The manufacturing method of the high power LED package according to claim 30, wherein*

*the first sheet metal member is formed with a lower end facing the second sheet metal member,*

*the lower end is cut slantwise away from the second sheet metal member to define a slant surface on the lower end, and*

*the slant surface is covered with the package body.*

*35. The manufacturing method of the high power LED package according to claim 30, wherein the second metal member is formed to have structure symmetrical to that of the first sheet metal member.*

*36. The manufacturing method of the high power LED package according to claim 30, further comprising:*

*forming a high reflectivity reflective layer on an inner surface of the recess.*

* * * * *